(12) United States Patent
Inglis et al.

(10) Patent No.: US 9,909,209 B2
(45) Date of Patent: Mar. 6, 2018

(54) LARGE AREA OPTICAL QUALITY SYNTHETIC POLYCRYSTALLINE DIAMOND WINDOW

(71) Applicant: Element Six Technologies Limited, London (GB)

(72) Inventors: Paul Nicholas Inglis, Berkshire (GB); John Robert Brandon, Oxfordshire (GB); Joseph Michael Dodson, Berkshire (GB); Timothy Peter Mollart, Oxfordshire (GB)

(73) Assignee: ELEMENT SIX TECHNOLOGIES LIMITED, London (GB)

( * ) Notice: Subject to any disclaimer, the term of this patent is extended or adjusted under 35 U.S.C. 154(b) by 697 days.

(21) Appl. No.: 14/362,826

(22) PCT Filed: Dec. 12, 2012

(86) PCT No.: PCT/EP2012/075246
§ 371 (c)(1),
(2) Date: Jun. 4, 2014

(87) PCT Pub. No.: WO2013/087702
PCT Pub. Date: Jun. 20, 2013

(65) Prior Publication Data
US 2014/0342122 A1 Nov. 20, 2014

Related U.S. Application Data

(60) Provisional application No. 61/576,552, filed on Dec. 16, 2011.

(30) Foreign Application Priority Data

Dec. 16, 2011 (GB) .................................. 1121640.5

(51) Int. Cl.
C23C 16/01 (2006.01)
C23C 16/27 (2006.01)
(Continued)

(52) U.S. Cl.
CPC ............ *C23C 16/274* (2013.01); *C23C 16/01* (2013.01); *C23C 16/4401* (2013.01);
(Continued)

(58) Field of Classification Search
CPC ... C23C 16/274; C23C 16/511; C23C 16/463; C23C 16/01; C23C 16/4586;
(Continued)

(56) References Cited

U.S. PATENT DOCUMENTS 5,134,965 A 8/1992 Tokuda
5,271,971 A 12/1993 Herb
(Continued)

FOREIGN PATENT DOCUMENTS

EP 0 791 949 A2 8/1997
JP H0745748 A 2/1995
(Continued)

OTHER PUBLICATIONS

Balmer, et al., "Chemical vapour deposition synthetic diamond: materials, technology and applications", J. Phys.: Condensed Matter, vol. 21, No. 36 (2009) 364221.
(Continued)

*Primary Examiner* — Nathan L Van Sell
(74) *Attorney, Agent, or Firm* — Bryan Cave LLP

(57) ABSTRACT

A polycrystalline chemical vapor deposited (CVD) diamond wafer comprising: a largest linear dimension equal to or greater than 125 mm; a thickness equal to or greater than 200 µm; and one or both of the following characteristics measured at room temperature (nominally 298 K) over at least a central area of the polycrystalline CVD diamond wafer,
(Continued)

said central area being circular, centered on a central point of the polycrystalline CVD diamond wafer, and having a diameter of at least 70% of the largest linear dimension of the polycrystalline CVD diamond wafer: an absorption coefficient $\leq 0.2$ cm$^{-1}$ at 10.6 µm; and a dielectric loss coefficient at 145 GHz, of tan $\delta \leq 2 \times 10^{-4}$.

12 Claims, 6 Drawing Sheets

(51) Int. Cl.
| | |
|---|---|
| C23C 16/44 | (2006.01) |
| C23C 16/455 | (2006.01) |
| C23C 16/458 | (2006.01) |
| C23C 16/46 | (2006.01) |
| C23C 16/511 | (2006.01) |
| C23C 16/56 | (2006.01) |
| H01J 37/32 | (2006.01) |
| G02B 1/113 | (2015.01) |

(52) U.S. Cl.
CPC .... *C23C 16/4586* (2013.01); *C23C 16/45563* (2013.01); *C23C 16/463* (2013.01); *C23C 16/466* (2013.01); *C23C 16/511* (2013.01); *C23C 16/56* (2013.01); *G02B 1/113* (2013.01); *H01J 37/32192* (2013.01); *H01J 37/32229* (2013.01); *H01J 37/32238* (2013.01); *Y10T 428/24355* (2015.01)

(58) Field of Classification Search
CPC .............. C23C 16/4401; C23C 16/466; C23C 16/45563; C23C 16/56; G02B 1/113; H01J 37/32238; H01J 37/32229; H01J 37/32192; Y10T 428/24355
See application file for complete search history.

(56) References Cited

U.S. PATENT DOCUMENTS

| | | | | |
|---|---|---|---|---|
| 5,472,787 | A | * | 12/1995 | Johnson ................ C23C 14/024 359/359 |
| 6,645,343 | B1 | | 11/2003 | Wild |
| 2008/0170981 | A1 | * | 7/2008 | Genis .................... C30B 29/04 423/446 |
| 2009/0127506 | A1 | * | 5/2009 | Twitchen .............. C30B 25/105 252/182.34 |
| 2010/0034984 | A1 | | 2/2010 | Asmussen |

FOREIGN PATENT DOCUMENTS

| | | |
|---|---|---|
| JP | 11049596 A | 2/1999 |
| WO | 2012/084660 A1 | 6/2012 |

OTHER PUBLICATIONS

Silva et al., "Microwave engineering of plasma-assisted CVD reactors for diamond deposition", J. Phys.: Condens. Matter, vol. 21, No. 36 (2009) 364202.
Test method for absorptance of optical laser components ISO/FDS 11551, International Organisation for Standardization, Geneva (1995).
Turri, et al., "Optical absorption, depolarization, and scatter of epitaxial single-crystal chemical-vapor-deposited diamond at 1.064 µm", Optical Engineering 46(6), 064002 (2007).
Sussmann et al., "Properties of bulk polycrystalline CVD diamond", Diamond and Related Materials, 3 (1994) pp. 303-312.
Davies, et al., "Strength of free-standing chemically vapour-deposited diamond measured by a range of techniques", Philosophical Magazine vol. 83, No. 36, 4059-4070 (2003).
Twitchen, et al., "Thermal conductivity measurements on CVD diamond", Diamond and Related materials, 10 (2001) 731-735.
Stover, "Optical Scattering: measurement and analysis", SPIE Press Monograph (1995).
Koidl et al., "Large area microwave-plasma CVD of diamond wafers for optical and thermal applications", IUMRS International Conference in Asia 1998.
Sussmann et al. "Optical and dielectric properties of CD polycrystalline diamond plates", Proceedings of SPIE, the International Society of Optical Engineering 1994 Society of Photo-Optical Instrumentation Engineers, vol. 2286, 1994, pp. 229-238.
Anonymous, "CVD Diamond", Jul. 9, 2002, retrieved from the Internet: URL—http://www.ddk.com/PDFs/CVDDiamond.pdf (retrieved on Mar. 13, 2013).
Wort et al., "Recent advances in the quality of CVD diamond optical components", proceedings of Spie, vol. 3705, Jan. 1, 1999, pp. 119-128.
Coe et al., "Optical, thermal and mechanical properties of CVD diamond", Diamond and Related Materials, vol. 9, No. 9-10, Sep. 1, 2000, pp. 1726-1729.
King et al., "Scaling the microwave plasma-assisted chemical vapor diamond deposition process to 150-200 mm substrates", Diamond and Related Materials, vol. 17, No. 4-5, Apr. 1, 2008, pp. 520-524.
Seo-S-H, et al., "Roughness control of polycrystalline diamond films grown by bias-enhanced microwave plasma-assisted CVD", Diamond and Related Materials, vol. 12, No. 10-11, Oct. 1, 2003, pp. 1670-1674.
Woerner et al., "CVD diamond optical lenses", Diamond and Related Materials, vol. 10, (Jan. 1, 2001), pp. 557-560.
Paolo Dore et al., "Infrared properties of chemical-vapor deposition of polycrystalline diamond wafers", Applied Optics, Vo. 37, No. 24, (Aug. 20, 1998), pp. 5731-5736.
Search Report for GB1222319.4 dated Apr. 15, 2013.
International Search Report for PCT/EP12/075246 dated Jun. 12, 2013.
Search Report for GB1121640.5 dated May 29, 2012.
Search Report for GB1208582.5 dated Sep. 20, 2012.
International Search Report for PCT/EP2012/075458 dated Apr. 12, 2013.
Search Report for GB1222506.6 dated Apr. 12, 2013.
UK IPO Combined Search and Examination Report for GB1422695.5 dated Jun. 30, 2015.
UK IPO Combined Search and Examination Report for GB1422696.3 dated Jul. 1, 2015.

* cited by examiner

LARGE AREA OPTICAL QUALITY SYNTHETIC POLYCRYSTALLINE DIAMOND WINDOW

FIELD OF INVENTION

The present invention relates to the fabrication of optical quality synthetic polycrystalline diamond windows using a chemical vapour deposition (CVD) technique.

BACKGROUND OF INVENTION

Chemical vapour deposition (CVD) processes for synthesis of diamond material are now well known in the art. Useful background information relating to the chemical vapour deposition of diamond materials may be found in a special issue of the Journal of Physics: Condensed Matter, Vol. 21, No. 36 (2009) which is dedicated to diamond related technology. For example, the review article by R. S Balmer et al. gives a comprehensive overview of CVD diamond materials, technology and applications (see "Chemical vapour deposition synthetic diamond: materials, technology and applications" J. Phys.: Condensed Matter, Vol. 21, No. 36 (2009) 364221).

Being in the region where diamond is metastable compared to graphite, synthesis of diamond under CVD conditions is driven by surface kinetics and not bulk thermodynamics. Diamond synthesis by CVD is normally performed using a small fraction of carbon (typically <5%), typically in the form of methane although other carbon containing gases may be utilized, in an excess of molecular hydrogen. If molecular hydrogen is heated to temperatures in excess of 2000 K, there is a significant dissociation to atomic hydrogen. In the presence of a suitable substrate material, synthetic diamond material can be deposited.

Atomic hydrogen is essential to the process because it selectively etches off non-diamond carbon from the substrate such that diamond growth can occur. Various methods are available for heating carbon containing gas species and molecular hydrogen in order to generate the reactive carbon containing radicals and atomic hydrogen required for CVD diamond growth including arc-jet, hot filament, DC arc, oxy-acetylene flame, and microwave plasma.

Methods that involve electrodes, such as DC arc plasmas, can have disadvantages due to electrode erosion and incorporation of material into the diamond. Combustion methods avoid the electrode erosion problem but are reliant on relatively expensive feed gases that must be purified to levels consistent with high quality diamond growth. Also the temperature of the flame, even when combusting oxy-acetylene mixes, is insufficient to achieve a substantial fraction of atomic hydrogen in the gas stream and the methods rely on concentrating the flux of gas in a localized area to achieve reasonable growth rates. Perhaps the principal reason why combustion is not widely used for bulk diamond growth is the cost in terms of kWh of energy that can be extracted. Compared to electricity, high purity acetylene and oxygen are an expensive way to generate heat. Hot filament reactors while appearing superficially simple have the disadvantage of being restricted to use at lower gas pressures which are required to ensure relatively effective transport of their limited quantities of atomic hydrogen to a growth surface.

In light of the above, it has been found that microwave plasma is the most effective method for driving CVD diamond deposition in terms of the combination of power efficiency, growth rate, growth area, and purity of product which is obtainable.

A microwave plasma activated CVD diamond synthesis system typically comprises a plasma reactor vessel coupled both to a supply of source gases and to a microwave power source. The plasma reactor vessel is configured to form a resonance cavity supporting a standing microwave. Source gases including a carbon source and molecular hydrogen are fed into the plasma reactor vessel and can be activated by the standing microwave to form a plasma in high field regions. If a suitable substrate is provided in close proximity to the plasma, reactive carbon containing radicals can diffuse from the plasma to the substrate and be deposited thereon. Atomic hydrogen can also diffuse from the plasma to the substrate and selectively etch off non-diamond carbon from the substrate such that diamond growth can occur.

A range of possible microwave plasma reactors for synthetic diamond film growth using a CVD process are known in the art. Such reactors have a variety of different designs. Common features include: a plasma chamber; a substrate holder disposed in the plasma chamber; a microwave generator for forming the plasma; a coupling configuration for feeding microwaves from the microwave generator into the plasma chamber; a gas flow system for feeding process gases into the plasma chamber and removing them therefrom; and a temperature control system for controlling the temperature of a substrate on the substrate holder.

A useful overview article by Silva et al. summarizing various possible reactor designs is given in the previous mentioned Journal of Physics (see "Microwave engineering of plasma-assisted CVD reactors for diamond deposition" J. Phys.: Condens. Matter, Vol. 21, No. 36 (2009) 364202). Having regard to the patent literature, U.S. Pat. No. 6,645,343 (Fraunhofer) discloses an example of a microwave plasma reactor configured for diamond film growth via a chemical vapour deposition process. The reactor described therein comprises a cylindrical plasma chamber with a substrate holder mounted on a base thereof. A cooling device is provided below the substrate holder for controlling the temperature of a substrate on the substrate holder. Furthermore, a gas inlet and a gas outlet are provided in the base of the plasma chamber for supplying and removing process gases. A microwave generator is coupled to the plasma chamber via a high-frequency coaxial line which is subdivided at its delivery end above the plasma chamber and directed at the periphery of the plasma chamber to an essentially ring-shaped microwave window in the form of a quartz ring mounted in a side wall of the plasma chamber.

Using microwave plasma reactors such as those disclosed in the prior art it is possible to grow polycrystalline diamond wafers by chemical vapour deposition on a suitable substrate such as a silicon wafer or a carbide forming refractory metal disk. Such polycrystalline CVD diamond wafers are generally opaque in their as-grown form but can be made transparent by polishing opposing faces of the wafers to produce transparent polycrystalline diamond windows for optical applications.

Diamond material is useful as an optical component as it has a broad optical transparency from ultraviolet through to infrared. Diamond material has the additional advantage over other possible window materials in that it is mechanically strong, inert, and biocompatible. For example, the inertness of diamond material makes it an excellent choice for use in reactive chemical environments where other optical window materials would not be suitable. Further still, diamond material has very high thermal conductivity and a low thermal expansion coefficient. As such, diamond material is useful as an optical component in high energy beam applications where the component will tend to be heated. The diamond material will rapidly conduct away heat to cool areas where heating occurs so as to prevent heat build-up at a particular point, e.g. where a high energy beam passes through the material. To the extent that the material is heated, the low thermal expansion coefficient of diamond material ensures that the component does not unduly deform which may cause optical and/or mechanical problems in use.

One problem with fabricating polycrystalline CVD diamond optical components is that during the CVD growth process impurities such as nitrogen, silicon and non-diamond carbon are incorporated into the diamond material as discussed below.

Atmospheric nitrogen is generally present as an impurity within source process gases and may also be present as a residual impurity within CVD reactor components due, for example, to non-perfect vacuum seals and/or residual impurities adsorbed onto interior surfaces of the CVD reactor which may desorb during use. Furthermore, nitrogen gas is often intentionally introduced into the CVD synthesis atmosphere during a synthetic diamond growth process as it is known that nitrogen increases the growth rate of synthetic diamond material. While nitrogen is advantageous for achieving commercially useful growth rates, incorporation of nitrogen into the synthetic diamond material can detrimentally affect the optical and thermal performance characteristics of the material. Accordingly, a balance may be struck between providing sufficient nitrogen within the CVD synthesis atmosphere to achieve acceptable growth rates while limiting the quantity of nitrogen which is incorporated into the solid CVD diamond material being grown. Apparatus and process conditions can affect the rate at which nitrogen within the CVD synthesis atmosphere is incorporated into the solid CVD diamond material being grown.

Silicon impurities may come from silicon based components within the CVD reactor. For example, quartz windows or bell jars are often used to couple microwaves into the plasma chamber and/or constrain plasma and process gases near a substrate growth surface to achieve CVD diamond growth. Such silicon containing quartz components are exposed to extreme temperatures from the plasma in use and this can result in silicon from these components being incorporated into the synthetic diamond material. Apparatus and process conditions can affect the rate at which silicon is incorporated into the solid CVD diamond material being grown.

Non-diamond carbon (e.g. sp2 hybridized graphitic carbon) is inevitably deposited on the growth surface of the substrate during CVD diamond growth processes. As previously described, atomic hydrogen is essential to a CVD diamond growth process because it selectively etches off non-diamond carbon from the substrate such that diamond growth can occur. However, this selective etching process does not usually remove all the deposited non-diamond carbon and such material therefore becomes incorporated into the CVD diamond material. Apparatus and process conditions can affect the rate at which non-diamond carbon is incorporated into the solid CVD diamond material being grown.

In light of the above, it is evident that the apparatus configuration and process conditions must be carefully selected and controlled in order to ensure that the level of impurities incorporated into the synthetic diamond material during CVD growth are extremely small for high performance optical components.

In addition to control of absolute impurity levels, it is also critical to ensure that the uniformity of impurity uptake is controlled so as to achieve a product which has consistent performance characteristics. Uniformity is an issue in terms of spatial variations in the rate of impurity uptake across a growth surface and temporal variations in the rate of impurity uptake over a growth run. For example, a non-uniform distribution of physical and/or chemical process parameters over the growth surface can lead to spatial variations in the rate of impurity uptake across a synthetic polycrystalline diamond wafer. Furthermore, as a synthetic polycrystalline diamond wafer grows, grain boundaries within the synthetic polycrystalline diamond wafer increase in size. An increase in the size of grain boundaries as the synthetic polycrystalline diamond wafer grows thicker leads to an increase in the rate of impurity uptake within the enlarged grain boundaries which can result in an increasing concentration of impurities through the thickness of a synthetic polycrystalline diamond wafer.

In addition to the above described problems, variations in growth rate across a synthetic polycrystalline diamond wafer can lead to variations in impurity uptake. For example, as the growth rate increases the time available to etch non-diamond carbon from the growth surface before it is encapsulated within the synthetic polycrystalline diamond wafer decreases. Furthermore, variations in growth rate also cause variations in thickness which can lead to strain and cracking of synthetic polycrystalline diamond wafer on cooling after completion of the CVD growth process. Variations in growth rate can be caused by non-uniformities in the plasma across the growth surface and non-uniformities in the temperature of the substrate on which the synthetic polycrystalline diamond wafer is grown.

Despite the above problems, to date it has been possible to fabricate high optical quality polycrystalline diamond wafer up to approximately 100 mm in diameter. However, the production of larger polycrystalline diamond wafers of high optical quality has proved problematic. While it has been possible to fabricate larger polycrystalline diamond wafers, these have been of lower optical quality, particularly towards the periphery of the wafers. Such wafers do not meet the requirements for certain commercial applications which require relatively thick, relatively large diameter synthetic polycrystalline diamond windows of extremely high optical quality. For example, certain very high powered laser beam applications require >120 mm diameter clear aperture, optical grade, polycrystalline diamond laser windows capable of handling the extreme power densities involved. Polycrystalline diamond laser windows with the relevant optical properties are available in smaller sizes. However these sizes are not large enough for certain applications. Such polycrystalline diamond windows are also required for use as radiation resistant windows.

It is an aim of certain embodiments of the present invention to provide a suitable microwave plasma reactor configuration and suitable CVD process conditions in order to fabricate large (e.g. at least 120 mm diameter) synthetic polycrystalline diamond windows having extremely high optical quality across substantially all (e.g. at least 80%) of the window area.

SUMMARY OF INVENTION

According to a first aspect of the present invention there is provided a polycrystalline chemical vapour deposited (CVD) diamond wafer comprising:

a largest linear dimension equal to or greater than 125 mm;

a thickness equal to or greater than 200 μm; and one or both of the following characteristics measured at room temperature (nominally 298 K) over at least a central area of the polycrystalline CVD diamond wafer, said central area being circular, centred on a central point of the polycrystalline CVD diamond wafer, and having a diameter of at least 70% of the largest linear dimension of the polycrystalline CVD diamond wafer:

(1) an absorption coefficient≤0.2 cm$^{-1}$ at 10.6 μm; and
(2) a dielectric loss coefficient at 145 GHz, of tan δ≤2×10$^{-4}$.

Preferably, the polycrystalline CVD diamond wafer further comprises one or more of the following structural characteristics over at least the central area:

(3) a tensile rupture strength with a nucleation face of the polycrystalline CVD diamond wafer in tension of: ≥760 MPa×n for a thickness of 200 to 500 μm; ≥700 MPa×n for a thickness of 500 to 750 μm; ≥650 MPa×n for a thickness of 750 to 1000 μm; ≥600 MPa×n for a thickness of 1000 to 1250 μm; ≥550 MPa×n for a thickness of 1250 to 1500 μm; ≥500 MPa×n for a thickness of 1500 to 1750 μm; ≥450 MPa×n for a thickness of 1750 to 2000 μm; or ≥400 MPa×n for a thickness of ≥2000 μm, wherein multiplying factor n is 1.0, 1.1, 1.2, 1.4, 1.6, 1.8, or 2;

(4) a tensile rupture strength with a growth face of the polycrystalline CVD diamond wafer in tension of: ≥330 MPa×n for a thickness of 200 to 500 μm; ≥300 MPa×n for a thickness of 500 to 750 μm; ≥275 MPa×n for a thickness of 750 to 1000 μm; ≥250 MPa×n for a thickness of 1000 to 1250 μm; ≥225 MPa×n for a thickness of 1250 to 1500 μm; ≥200 MPa×n for a thickness of 1500 to 1750 μm; ≥175 MPa×n for a thickness of 1750 to 2000 μm; or ≥150 MPa×n for a thickness of ≥2000 μm, wherein multiplying factor n is 1.0 1.1, 1.2, 1.4, 1.6, 1.8, or 2; and (5) a surface flatness≤5 μm, ≤4 μm, ≤3 μm, ≤2 μm, ≤1 μm, ≤0.5 μm, ≤0.2 μm, ≤ or 0.1 μm.

Preferably, the polycrystalline CVD diamond wafer further comprises one or more of the following characteristics over at least the central area:

(6) an average black spot density no greater than 1 mm$^{-2}$, 0.5 mm$^{-2}$, or 0.1 mm$^{-2}$;

(7) a black spot distribution such that there are no more than 4, 3, 2, or 1 black spots within any 3 mm$^2$ area;

(8) an integrated absorbance per unit thickness of no more than 0.20 cm$^{-2}$, 0.15 cm$^{-2}$, 0.10 cm$^{-2}$, or 0.05 cm$^{-2}$, when measured with a corrected linear background in a range 2760 cm$^{-1}$ to 3030 cm$^{-1}$;

(9) a thermal conductivity of no less than 1900 Wm$^{-1}$K$^{-1}$, 2000 Wm$^{-1}$K$^{-1}$, 2100 Wm$^{-1}$K$^{-1}$, or 2200 Wm$^{-1}$K$^{-1}$;

(10) a total integrated scatter in a forward hemisphere no more than 1%, 0.5%, or 0.1% at 10.6 μm for a sample thickness of 0.7 mm with front and rear surfaces polished to a root mean squared roughness of less than 15 nm; and

(11) a silicon concentration as measured by secondary ion mass spectrometry of no more than 10$^{17}$ cm$^{-3}$, 5×10$^{16}$ cm$^{-3}$, 10$^{16}$ cm$^{-3}$, 5×10$^{15}$ cm$^{-3}$, or 10$^{15}$ cm$^{-3}$.

Embodiments may comprise any combination of the aforementioned preferred characteristics. However, of the eleven recited characteristics given above, the polycrystalline CVD diamond wafer preferably comprises two, three, four, five, six, seven, eight, nine, ten, or most preferably all eleven of said characteristics.

According to a second aspect of the present invention there is provided a microwave plasma reactor for fabricating a polycrystalline CVD diamond wafer as define above, the microwave plasma reactor comprising:

a plasma chamber comprising a base, a top plate, and a side wall extending from said base to said top plate defining a resonance cavity for supporting a microwave resonance mode, wherein the resonance cavity has a central rotational axis of symmetry extending from the base to the top plate;

a microwave coupling configuration comprising an annular dielectric window for inductively coupling microwaves into the plasma chamber through the top plate via a ring shaped dielectric window in a direction towards the base of the plasma chamber;

a gas flow system for feeding process gases into the plasma chamber through the top plate via one or more gas inlet nozzles in a direction towards the base of the plasma chamber;

a substrate holder disposed in the base of the plasma chamber and comprising a supporting surface for supporting a substrate on which the polycrystalline CVD diamond wafer can be grown in use; and a substrate temperature control system comprising a coolant delivery system for supplying liquid and/or gas coolant to the substrate holder to control a temperature profile across the supporting surface of the substrate holder in use, wherein at least the annular dielectric window is rotationally symmetric, having a rotational axis of symmetry lying within 0.2 mm of the central rotational axis of symmetry of the resonance cavity.

According to a third aspect of the present invention there is provided a process for fabricating the polycrystalline CVD diamond wafer using a microwave plasma reactor as defined above, the process comprising:

locating a substrate over the substrate holder, the substrate being rotationally symmetric and having a rotation axis of symmetry lying within 1.0 mm of the central rotational axis of symmetry of the resonance cavity when located over the substrate holder;

feeding microwaves into the plasma chamber through the annular dielectric window at a power in a range 15 to 40 kW;

feeding process gases into the plasma chamber through the one or more gas inlet nozzles, the process gases comprising an atomic concentration of hydrogen in a range 98 to 99%, an atomic concentration of carbon in a range 0.3 to 1.1%, and an atomic concentration of nitrogen in a range 30 to 270 ppm, wherein a total flow rate of the process gases lies in a range 2000 to 15000 sccm and a pressure within the plasma chamber lies in a range 140 to 235 Torr;

growing a polycrystalline CVD diamond wafer on the substrate at a substrate temperature in a range 775 to 950° C.;

removing the polycrystalline CVD diamond wafer from the microwave plasma reactor; and polishing the polycrystalline CVD diamond wafer.

Certain embodiments of the present invention have been realized by: (i) developing a particular microwave plasma reactor configuration; (ii) further modifying the microwave plasma reactor configuration to extremely precise design tolerances; and (iii) developing suitable process conditions for operating the microwave plasma reactor configuration to achieve fabrication of large synthetic polycrystalline diamond windows having extremely high optical quality.

Having regard to point (i), the microwave plasma reactor is configured to couple both process gas, via one or more gas inlet nozzles, and microwaves, via an annular dielectric window, through a top plate of the plasma chamber towards a suitably temperature controlled substrate mounted in a base of the plasma chamber such that both process gas and microwaves are coupled into the plasma chamber in a rotationally symmetric manner and directed towards the substrate growth surface. Such a configuration has been found to be useful in allowing high gas flow rates, high process pressures, and high microwave power process conditions to be used for achieving good quality synthetic diamond growth at high growth rates with a suitably controlled nitrogen concentration. Furthermore, the provision of an annular dielectric window around a peripheral region of the top plate of the plasma chamber can reduce silicon transfer into the synthetic diamond material during growth when compared with alternatives such as the use of a bell jar, the use of a window spanning across a central portion of the plasma chamber, or an annular dielectric window disposed in a side wall of the plasma chamber, all of which increase exposure of the dielectric window material to a plasma region within the chamber.

Having regard to point (ii), it has been found that even utilizing such a configuration it is not possible to fabricate large area (≥120 mm diameter), thick (≥200 μm) windows of synthetic polycrystalline diamond having extremely high optical quality and no cracking. This problem has been traced to very minor misalignments in the microwave coupling configuration, the gas delivery system, and the substrate mounting and temperature control systems relative to the central rotational axis of symmetry of the plasma chamber. While minor misalignments do not manifest themselves in terms of a significant reduction in the quality of synthetic diamond material grown over smaller areas (e.g. ≤100 mm diameter), it has been found that when fabricating synthetic diamond material over larger areas (≥120 mm diameter) even very minor misalignments between components can detrimentally affect material quality, particularly around a peripheral region of the synthetic polycrystalline diamond wafer. As such, it has been found that the components, particularly the annular dielectric window, should be rotationally symmetric with each component having a rotational axis of symmetry lying within 0.2 mm of a central rotational axis of symmetry of the resonance cavity. Preferably other components such as the substrate holder and the one or more gas inlet nozzles should also be precisely configured and aligned. Such precise alignment, in combination with the previously described configuration in which process gas and microwaves are both coupled into the plasma chamber in an axial direction towards the substrate growth surface, allows high gas flow rates and high microwave power conditions to be achieved with a high degree of rotational symmetry which has been found to be critical for achieving the fabrication of large area, thick windows of synthetic polycrystalline diamond having extremely high optical quality.

Having regard to point (iii), it has been found that even utilizing the previously described precisely-aligned microwave plasma reactor configuration, the quality of polycrystalline diamond material around a peripheral region of the polycrystalline diamond wafer may not meet extremely high optical quality requirements. In particular, levels of impurities such as non-diamond carbon have been found to increase at a peripheral region of larger area wafers. This problem is exacerbated when also growing to larger thicknesses because as a synthetic polycrystalline diamond wafer grows, grain boundaries increase in size and this leads to an increase in the rate of impurity uptake within the grain boundaries. It has been found that this problem can be alleviated by increasing the hydrogen gas flow rate. It is considered that the concentration of atomic hydrogen required to selectively etch off non-diamond carbon from the substrate is lower at very large diameters and thus the efficiency of non-diamond carbon etching is reduced. It is believed that increasing the hydrogen gas flow rate directed towards the growth surface pushes more atomic hydrogen to peripheral regions of the polycrystalline diamond wafer thus increasing the rate at which non-diamond carbon is etched from the growth surface and improving the quality of the material in peripheral regions of the growing wafer. An alternative or additional solution is to provide a gas inlet nozzle array having a plurality of gas inlet nozzles directed towards the growth surface of the substrate and disposed over an area sufficiently large to ensure that a sufficiently large concentration of atomic hydrogen is provided in peripheral regions of a polycrystalline diamond wafer during growth. Yet another alternative or additional solution is to reduce the growth rate of the polycrystalline CVD diamond wafer to allow more time for non-diamond carbon to be etched from the growth surface. For example, the growth rate may be decreased as a thickness of the polycrystalline CVD diamond wafer increases by, for example, reducing the atomic concentration of carbon and/or the atomic concentration of nitrogen during growth of the polycrystalline CVD diamond wafer on the substrate.

By combining developments in reactor design, engineering tolerance control, and process design it has been possible to achieve fabrication of large synthetic polycrystalline diamond windows having extremely high optical quality.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION

Figure 1:
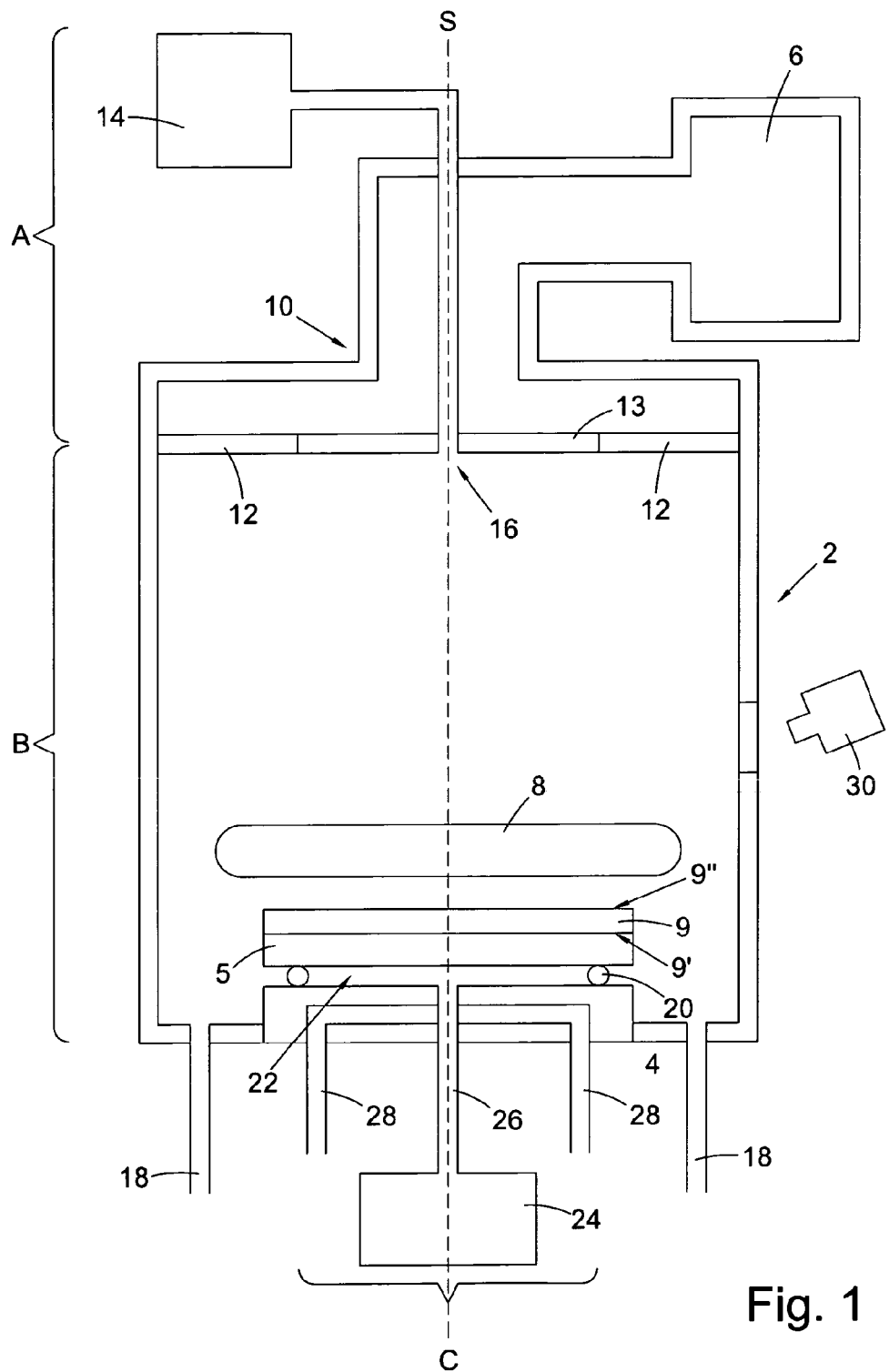
FIG. 1 illustrates a microwave plasma reactor configured to fabricate large area optical quality polycrystalline CVD diamond wafers.

The microwave plasma reactor illustrated in FIG. 1 comprises the following components: a plasma chamber 2; a substrate holder 4; a substrate 5; a microwave generator 6; plasma 8 generated in use for growing a polycrystalline CVD diamond wafer 9 having a nucleation face 9' and a growth face 9"; a microwave coupling configuration 10;

dielectric window 12; source gas container system 14; one or more gas inlets 16; one or more gas outlets 18; spacer wires or spacer pads 20 to define a gas gap 22 between a supporting surface of the substrate holder 4 and a rear surface of the substrate 5; and a substrate temperature control arrangement comprising a gas supply system 24 coupled to the gas gap 22 via a supply pipe 26, and a coolant liquid supply system 28 for cooling the substrate holder.

The microwave plasma reactor can be considered to comprise three subsystems: (A) gas and microwave delivery systems configured to deliver process gases and microwaves into a plasma chamber through a top plate of the plasma chamber; (B) a plasma chamber comprising a base, a top plate, and a side wall extending from the base to the top plate defining a resonance cavity for supporting a microwave resonance mode, the resonance cavity comprising a central rotational axis of symmetry S extending from the base to the top plate; and (C) a substrate mounting configuration comprising a substrate holder disposed in the base of the plasma chamber providing a supporting surface for supporting a substrate on which the polycrystalline CVD diamond wafer can be grown in use and a substrate temperature control system comprising a coolant delivery system for supplying liquid and/or gas coolant to the substrate holder to control a temperature profile across the supporting surface of the substrate holder in use.

Each of the subsystems will be described in more detail below.

(A) the Gas and Microwave Delivery System

The microwave coupling configuration 10 comprises a coaxial waveguide configured to feed microwaves from a rectangular waveguide to an annular dielectric window 12. The coaxial waveguide comprises an inner conductor and an outer conductor. The annular dielectric window is made of a microwave permeable material such as quartz which forms a vacuum-tight window in a top portion of the plasma chamber. The microwave generator 6 and the microwave coupling configuration 10 are configured to generate a suitable wavelength of microwaves and inductively couple the microwaves into the plasma chamber to form a standing wave within the plasma chamber having a high energy anti-node located just above the substrate 5 in use.

Figure 2A:
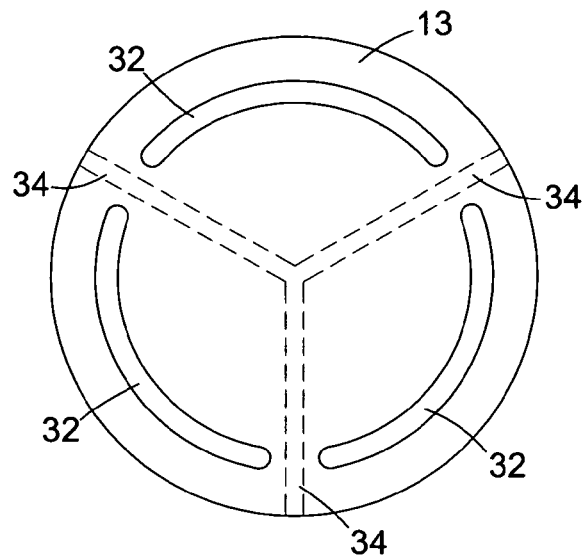
FIGS. 2(a), 2(b) and 3 illustrate components of a microwave coupling configuration for coupling microwaves into a plasma chamber.
Figure 2B:
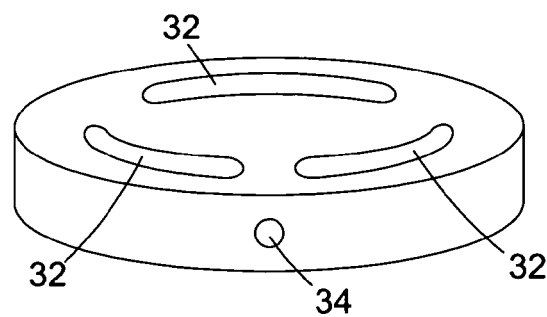

The microwave coupling configuration 10 further comprises a waveguide plate 13. The waveguide plate 13 and its mounting configuration are illustrated in more detail in FIGS. 2(a), 2(b), and 3. The waveguide plate 13 comprising a plurality of apertures 32 disposed in an annular configuration, each aperture forming a waveguide for coupling microwaves from the coaxial waveguide into the plasma chamber through the annular dielectric window 12. The waveguide plate may also comprise a plurality of channels 34 extending between the apertures suitable for supplying coolant and/or process gas from an outer circumferential region to an inner axial region.

This configuration has been found to be advantageous as it allows microwave power to be coupled into the plasma chamber via an annular dielectric window while also allowing of the provision of coolant and/or process gases to regions of the plasma chamber enclosed by the waveguide structure.

In addition to the above, the waveguide plate can be configured to support the central conductor of the coaxial waveguide. Accordingly, while the central conductor illustrated in FIG. 1 is a grounded post, in one alternative arrangement the central conductor can be formed as an electrically floating post which is not required to be grounded on an upper wall of the rectangular waveguide from the microwave generator. An inner conductor which is electrically floating in the waveguide is in many respects a simpler and more convenient method of transferring power from a rectangular to a coaxial waveguide. This has the disadvantage of losing the grounded point at which services such as coolant water and process gas can be introduced through the central conductor as shown in FIG. 1. However, certain embodiments of the present invention provide an alternative route for supplying such services via channels in the waveguide plate.

Furthermore, the waveguide plate can be configured to couple together upper and lower portions of the plasma chamber and avoid large compressive stresses on the annular dielectric window in use without the use of a mechanical anchor point through a central conductor of the coaxial waveguide. Further still, the annular dielectric window may comprise two opposing surfaces through which microwaves are coupled into the plasma chamber and seals may be provided on said two opposing surfaces. This allows for a reliable seal to be formed between upper and lower portions of the plasma chamber and at the dielectric window.

Figure 3:
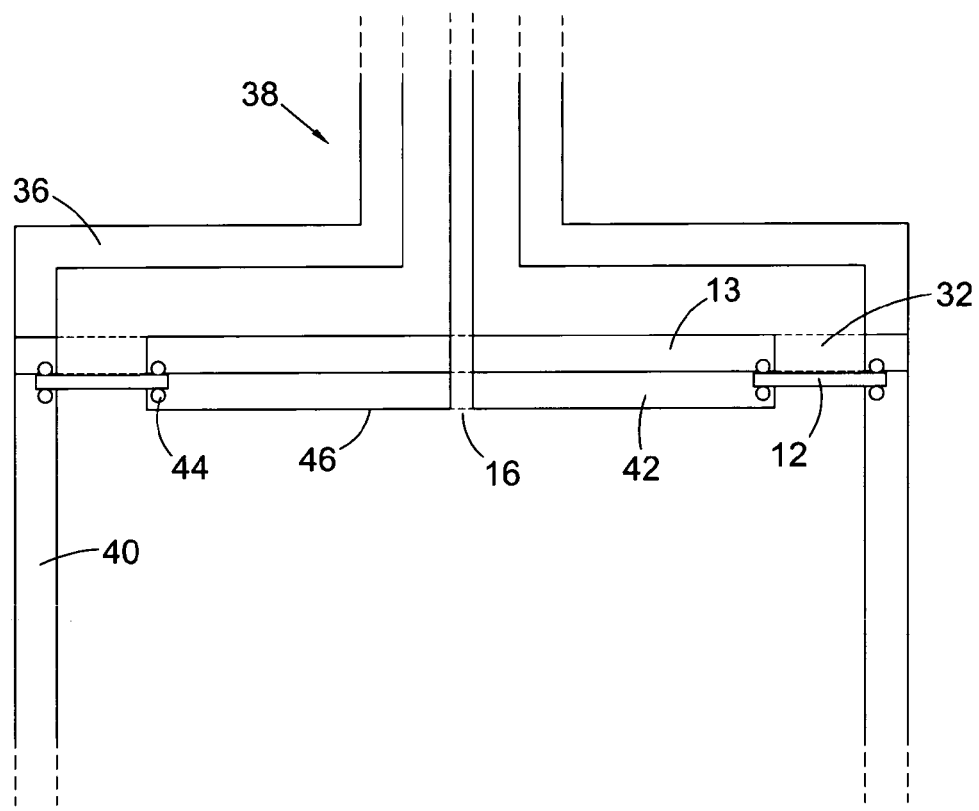

FIG. 3 shows a cross-sectional view of a portion of the microwave plasma reactor illustrating an example of how the annular dielectric window 12 and waveguide plate 13 can be mounted in the reactor. In the illustrated arrangement, an outer peripheral portion of the waveguide plate 13 is disposed between the outer conductor 36 of the coaxial waveguide 38 and a side wall 40 of the plasma chamber. An outer peripheral portion of the annular dielectric window 12 is disposed between the waveguide plate 13 and the side wall 40 of the plasma chamber. An inner portion of the annular dielectric window 12 is held between an inner portion of the waveguide plate 13 and a further plate 42. The apertures 32 in the waveguide plate are aligned with the annular dielectric window 12 and channels 34 for supplying coolant and/or process gas pass between the apertures into the inner portion of the waveguide plate 13. The annular dielectric window 12 may be mounted to the waveguide plate using elastomer o-rings 44. In this arrangement the further plate 42 can be attached to the waveguide plate 13 with a portion of the dielectric window 12 disposed and held therebetween via elastomeric o-rings 44.

The waveguide plate as described above fulfils several advantageous functions:
 (i) it allows injection of coolant and/or process gases;
 (ii) it supports the central coaxial conductor;
 (iii) it forms a coupling between the upper and lower parts of the plasma chamber;
 (iv) it feeds microwaves from the coaxial waveguide into the plasma chamber in an axial direction towards the substrate; and
 (v) it supports an annular dielectric window.

In the illustrated embodiment, the plurality of apertures in the waveguide plate are configured to couple microwaves into the plasma chamber in a direction parallel to a central axis of the plasma chamber. In this arrangement, the waveguide plate is disposed in a plane perpendicular to a central axis of the plasma chamber and forms a portion of an upper wall in the plasma chamber. It has been found that coupling microwaves into the plasma chamber in a direction parallel to the axis of the chamber is more efficient and avoids the need for a more complex coaxial feed configuration. As such, even if channels for coolant and/or process gas are not provided in the waveguide plate, and/or no floating post is provided, the waveguide plate according to the present invention is still advantageous for coupling microwaves into the plasma chamber in an efficient and simple manner.

The plurality of apertures are preferably configured to have a periodic rotational symmetry. For example, if n apertures are provided, the apertures are configured symmetrically around a circle to have n fold rotational symmetry. A symmetric arrangement is preferred to avoid asymmetries in the electric field within the plasma chamber formed as a result of asymmetries in the apertures.

The annular dielectric window as previously described is formed of a single complete ring of dielectric material. However, in an alternative arrangement the annular dielectric window may be formed of a plurality of separate arcuate segments, each segment sealed across a corresponding aperture of the waveguide plate. The important features of embodiments of the present invention is that the annular dielectric window is rotationally symmetric and has a rotational axis of symmetry lying within 0.2 mm, 0.15 mm, 0.10 mm, or 0.05 mm of the central rotational axis of symmetry of the resonance cavity.

In one configuration the one or more channels extending between the apertures in the waveguide plate comprise at least one channel configured to supply process gas to one or more injection ports arranged opposite the substrate holder for injecting process gas towards the substrate holder. This configuration allows an axial gas flow arrangement to be disposed at the same end of the chamber as the microwave coupling configuration.

A central portion of the waveguide plate can support a conductive surface 46 disposed opposite the substrate holder. The conductive surface may be formed by the waveguide plate or may be formed by a separate metallic body which is connected to a central portion of the waveguide plate. One or more gas inlet nozzles 16 may be disposed in the conductive surface for injecting process gas towards the substrate holder. In one configuration, the conductive surface is curved and extends towards a central region of the plasma chamber. For example, the conductive surface may form a cone-shaped body. Such a conductive surface is useful as it can aid in preventing plasma formation in an upper region of the plasma chamber. Effectively, the conductive surface can mask off a high electric field region in use. That is, the conductive surface can be located to enclose a high electric field anti-node region which would exist in a corresponding chamber which did not comprise the conductive surface extending towards a central region of the plasma chamber.

The waveguide plate may include 2, 3, 4, 5, 6, 7 or more apertures. It has been found that varying the number of apertures can affect the efficiency at which microwaves are coupled into the plasma chamber. According to certain arrangements, the waveguide plate comprises an odd number of apertures, most preferably a prime number of apertures. For example, the waveguide plate may comprise 3, 5, or 7 apertures.

Each aperture is in effect equivalent to a rectangular waveguide. A three way aperture can help to maximize the length of the aperture. Four and six way alternatives have both been found to be deficient from the point of view of mode stability. Despite the presence of several apertures, the power can be predominantly coupled into the cavity in a $TM_{0mn}$ mode. There are effects from the symmetry of the apertures visible in the form of the generation of high order modes i.e. $TM_{1mn}$ (where 1 does not equal zero). Thus a three way aperture in which all three apertures are excited in phase will couple to the $TM_{3m}$ series of modes while the four and six way apertures might be expected to couple with the much higher order $TM_{8mn}$ and $TM_{12mn}$ modes. In practice however, the four and six way apertures are prone to parasitic modes. Thus a four or six way aperture can couple into the $TM_{2mn}$ modes. Overall the effect is that the four and six way apertures can produce asymmetries in the plasma that result in either the plasma moving off centre or splitting two ways. The three way aperture gives a stable three way pulling effect that is less undesirable than the more serious one way and two way break-up modes that occur with other configurations. Instabilities can be dealt with using mode cancelling blocks which are basically metal bodies that produce a perturbation to the local electric field that is intended to cancel that of the three way mode produced by the apertures. The position of these metal blocks can be established empirically. By placing them in regions of high wall current (i.e. where the H field is high) the blocks can be used to disrupt the unwanted mode. As such in one arrangement a plurality of mode cancelling blocks are disposed on an inner wall of the plasma chamber, for example on a side wall or on a base of the chamber, the mode cancelling blocks being configured to compensate for electromagnetic perturbations caused by the plurality of apertures. The mode cancelling blocks are spaced apart so as to be symmetrically related to the aperture configuration. For example, the number of mode cancelling blocks may be equal to the number of apertures provided in the waveguide plate, the mode cancelling blocks being positioned to have a symmetry which corresponds to the aperture arrangement. For example, if three apertures are provided in the waveguide plate then three mode cancelling blocks may be mounted around the plasma chamber wall in a lower portion of the plasma chamber and arranged symmetrically so as to cancel perturbations in the electric field caused by the apertures. Alternatively, the number of mode cancelling blocks may be an integer multiple of the number of apertures while still being arranged to be symmetrically related to the aperture configuration. The mode cancelling blocks can be adhered to an inner wall of the plasma chamber or may be integrally formed by a wall of the plasma chamber. Another possible alternative to the three way aperture is to use a five or seven way aperture. Because these are prime numbers they are resistant to over-moding with lower order two way modes etc. In this case the mode cancelling blocks may not be required.

It is further advantageous to supply microwave energy to a plasma chamber via apertures having a specific radial width. A ratio of the annular gap (in a radial direction) provided by the apertures in the waveguide plate to that of a diameter of the plasma chamber may be in the range 1/10 to 1/50, 1/20 to 1/40, 1/25 to 1/35, or optionally approximately 1/30. This annular gap may be provided by locating the apertures adjacent the side wall of the plasma chamber with the outer conductor of the coaxial waveguide being comparable in diameter to the diameter of the resonance cavity of the plasma chamber and the inner conductor being only slightly smaller than the outer conductor to achieve a ratio as previously specified for the annular gap. By varying the ratio of the diameters of these two conductors it is possible to find an optimum point at which a match to the chamber is achieved. In an alternative arrangement, the apertures may be placed away from the side walls of the plasma chamber, e.g. at an intermediate position between the centre and an edge of the top plate. Advantageously, the components of the chamber and microwave coupling assembly should be configured to a high degree of precision, e.g. such that dimensions and positioning of components is within 0.1% of the prescribed specification.

The gas supply system comprises a source gas container system 14, one or more gas inlets 16 and one or more gas outlets 18. One axially disposed gas inlet is illustrated in FIG. 1 in the centre of the top plate of the plasma chamber which also forms the previously described waveguide plate 13. Optionally, the gas inlet can be modified to provide an array of gas inlet nozzles across an area of the top plate of the plasma chamber.

The gas inlet is positioned in a top portion of the plasma chamber directly above the substrate holder and configured to directly feed gas at high velocity towards the substrate. Process gas is removed at one or more outlets in or near the base of the plasma chamber. Optionally, the process gas can be recirculated to the inlet using a pump. An advantage of such a system is that high velocity gas flow directed towards the substrate transports activated gas species from the plasma to the substrate by convection. This aids in increasing growth rates when compared with systems which rely upon diffusion of activated gas species from the plasma to the substrate. Furthermore, as previously discussed, by increasing the hydrogen gas flow rate using such an arrangement it is possible to push more atomic hydrogen to peripheral regions of the polycrystalline diamond wafer thus increasing the rate at which non-diamond carbon is etched from the growth surface and improving the quality of the material in peripheral regions of the growing wafer.

An alternative or additional solution is to provide a gas inlet nozzle array having a plurality of gas inlet nozzles directed towards the growth surface of the substrate and disposed over an area sufficiently large to ensure that a sufficiently large concentration of atomic hydrogen is provided in peripheral regions of a polycrystalline diamond wafer during growth. In this regard, a relatively high number of nozzles can be closely spaced to ensure a relatively uniform flow of gas. It has been found that providing a relatively high number density of nozzles in an array improves the uniformity of gas flow towards the substrate in use and allows the plasma to be uniformly flattened and shaped relative to the substrate to achieve uniform diamond film formation at high rates over a relatively large area. It has also been found to be useful to provide relatively small area nozzles such that the area of the nozzle array is largely made up of the space in-between the nozzles rather than the area of the nozzle outlets themselves. As such, whereas it has been found to be advantageous to provide a relatively large number density of nozzles in relation to the area of the nozzle inlet array, it has also been found to be advantageous to provide an array in which the ratio of the area of the nozzle inlets divided by the area of the nozzle array as a whole is low. It has been found that small nozzles are advantageous for providing high velocity directed gas flows. However, it is also desired to have a relatively uniform gas flow over a relatively large area for uniform deposition of a diamond film over a relatively large area. Accordingly, a combination of relatively small inlet nozzle size and a relatively high number density of such nozzles has been found to be advantageous to achieve a balance between high velocity directed gas flows and uniformity of gas flow over a relatively large area.

In light of the above, a modified gas flow system may comprise a gas inlet nozzle array comprising a plurality of gas inlet nozzles disposed opposite the substrate holder for directing process gases towards the substrate holder, the gas inlet nozzle array comprising: at least six gas inlet nozzles disposed in a substantially parallel or divergent orientation relative to a central axis of the plasma chamber (by substantially parallel we mean at least within 10°, 5°, 2°, or 1° of a perfect parallel arrangement); a gas inlet nozzle number density equal to or greater than 0.1 nozzles/cm², (but preferably much higher for certain applications) wherein the gas inlet nozzle number density is measured by projecting the nozzles onto a plane whose normal lies parallel to the central axis of the plasma chamber and measuring the gas inlet number density on said plane; and a nozzle area ratio of equal to or greater than 10 (but preferably much higher for certain applications), wherein the nozzle area ratio is measured by projecting the nozzles onto a plane whose normal lies parallel to the central axis of the plasma chamber, measuring the total area of the gas inlet nozzle area on said plane, dividing by the total number of nozzles to give an area associated with each nozzle, and dividing the area associated with each nozzle by an actual area of each nozzle.

In accordance with certain embodiments of the present invention the one or more gas inlet nozzles have a rotational axis of symmetry lying within 1.0 mm, 0.5 mm, 0.25 mm, 0.2 mm, 0.15 mm, 0.10 mm, or 0.05 mm of the central rotational axis of symmetry of the resonance cavity.

(B) The Plasma Chamber

The plasma chamber is configured to form a resonance cavity supporting a standing microwave in use. According to one configuration the plasma chamber is configured to support a $TM_{01n}$ standing microwave in use, e.g. a $TM_{011}$ mode. The operational frequency may be in a range 400 to 500 MHz or 800 to 1000 MHz.

It has also been found to be advantageous to provide a cylindrical resonance cavity configured to have a diameter which satisfies the condition that a ratio of the resonance cavity height/the resonance cavity diameter is in the range 0.3 to 1.0, 0.4 to 0.9, or 0.5 to 0.8. Such a ratio constitutes a relatively small diameter cavity when compared to prior art arrangements. Although it would seem counter-intuitive, it has been found that it is advantageous to use a plasma reactor chamber having a relatively small diameter to form a uniform, stable, large area plasma for achieving uniform CVD diamond growth over large areas. A relatively small diameter cavity can provide the following beneficial technical effects:

(i) Improve resonance mode purity within the chamber and avoid complex interactions between numerous modes during operation over the long time-scales required for CVD diamond synthesis. For example, a small diameter chamber can reduce the problem of slight temperature instabilities in the CVD diamond growth surface stimulating an unwelcome higher order mode.

(ii) A cavity formed within a specific, relatively small, diameter range is considered to allow the formation of localized higher order axis-symmetric modes at the substrate making the E-field across the substrate more uniform without forming very intense radial E-fields at the top corners of the substrate.

(iii) A small diameter cavity which has a relatively low Q factor is more easy to start and tune, and is less sensitive to variations in microwave source frequency.

Such a relatively small diameter cavity also helps to alleviate the problem of complex and interacting gas convection currents forming within the chamber leading to plasma instability. That is, the present inventors consider that a small diameter cavity provides a more simple and easier to control system in terms of both gas flow and microwave power within the plasma chamber such that a more uniform, stable, large area plasma can be formed and maintained to achieve uniform CVD diamond growth over large areas. At the same time, the diameter of the cavity should not be so small that the plasma becomes compressed and non-uniform across the substrate.

For example, the resonance cavity height, as measured from the base to the top plate of the plasma chamber, may lie in a range: 300 mm to 600 mm, 300 mm to 500 mm, or 400 mm to 500 mm at a microwave frequency f in the range 400 MHz to 500 MHz; or 150 mm to 300 mm, 150 mm to 250 mm, or 200 mm to 250 mm at a microwave frequency f in the range 800 MHz to 1000 MHz. The resonance cavity diameter may lie in the range: 400 mm to 1000 mm, 500 mm to 900 mm, or 600 mm to 800 mm at a microwave frequency f in the range 400 MHz to 500 MHz; or 200 mm to 500 mm, 250 mm to 450 mm, or 300 mm to 400 mm at a microwave frequency f in the range 800 MHz to 1000 MHz. The resonance cavity may have a volume in a range: 0.018 $m^3$ to 0.530 $m^3$, 0.062 $m^3$ to 0.350 $m^3$, 0.089 $m^3$ to 0.270 $m^3$, or 0.133 $m^3$ to 0.221 $m^3$ at a microwave frequency f in the range 400 to 500 MHz; or 0.002 $m^3$ to 0.06 $m^3$, 0.007 $m^3$ to 0.04 $m^3$, 0.01 $m^3$ to 0.03 $m^3$, or 0.015 $m^3$ to 0.025 $m^3$ at a microwave frequency f in the range 800 MHz to 1000 MHz.

One potentially problem when using a small cavity arrangement as described above is that of over heating in wall components of the chamber. However, it has been found to be advantageous to provide an arrangement in which the walls of the resonance cavity are exposed to the plasma in use, i.e. the plasma is not contained within a bell jar, to avoid silicon contamination. Plasma reactor vessels are usually manufactured from welded stainless steel as this is the accepted material of choice for ultra-high vacuum (UHV) chambers. However, it has been found that this creates problems with arcing at interfaces, soot formation on hot surfaces, and generally poor heat transfer. Furthermore, these chambers cost a large amount of money to build. Aluminium has been found to be a better material thermally and is also easy to machine. Thus, while stainless steel is a good material for vacuum chambers, its very poor thermal performance makes it not well suited to use in areas where high power densities are experienced. Materials such as aluminium, while not traditionally regarded as suitable for high vacuum, are actually quite good for reasonably high vacuum usage where conventional elastomer seals can be used.

In light of the above, the resonance cavity may comprise internal walls configured to be exposed to a plasma formed within the resonance cavity in use, the internal walls comprising metallic surfaces forming at least 75%, 80%, 85%, 90% or 95% of a total surface area of the internal walls within the resonance cavity. The metallic surfaces may be made of aluminium or an alloy thereof comprising at least 80%, 90%, 95%, or 98% by weight of aluminium. Furthermore, a portion of the internal walls formed by the annular dielectric window, is preferably no more than 25%, 20%, 15%, 10%, or 5% of the total surface area of the internal walls within the resonance cavity.

Although a basic cylindrical chamber configuration is illustrated in FIG. 1, additional optional features may be provided. For example, projections from a wall of the chamber may be provided in certain instances. These may be provided to modify the electric field formed near the substrate, introducing a vertical asymmetry which increases the electric field above the substrate relative to the electric field at an opposite end of the plasma chamber where plasma formation is not desirable. In addition, such projections can function as a mode filter, aiding stability and/or purity of the electric field which drives the plasma. Such projections may also be provided to alter the thermal properties of the plasma which can aid in improving uniformity of CVD diamond growth, function as a physical boundary to confine the plasma in use and prevent the plasma from deviating from an axially central location above the substrate, and/or interrupt gas flow up a side wall of the plasma chamber thereby reducing gas entrainment and unwanted convection currents within the chamber which would otherwise destabilize the inlet gas streams and/or the plasma. In such cases, it should be ensured that any additional structure provided within the plasma chamber have a high degree of rotational symmetry and alignment with the rotational symmetry axis of the plasma chamber to achieve good optical quality material out to large diameters.

(C) The Substrate Mounting Configuration

Figure 4A:
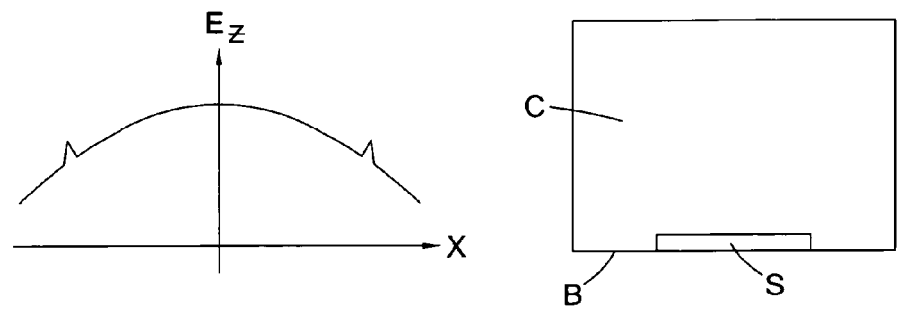
FIGS. 4(a) to 4(c) show electric field profile plots for varying heights of substrate within a microwave plasma reactor.
Figure 4B:
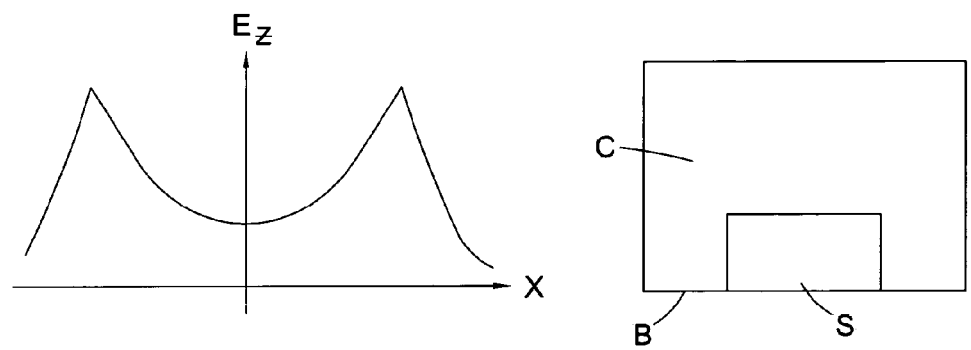
Figure 4C:
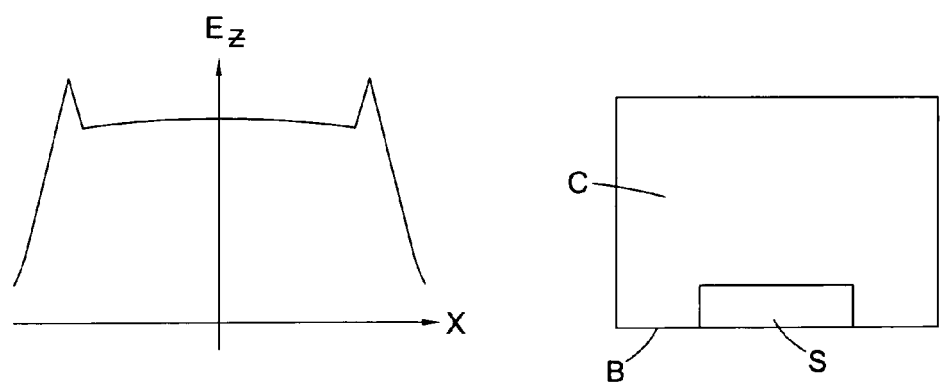

It has been found that the electric field profile is significantly perturbed when a substrate is introduced into the resonance cavity as can be shown by modelling or empirical measurement. In this regard, FIGS. 4(a) to 4(c) illustrate electric field profile plots showing how the electric field varies with differing height of a substrate within a resonance cavity of a plasma reactor. The plots show the magnitude of the electric field $E_z$ on the Y-axis against the lateral position X across the diameter of the resonance cavity above the substrate.

FIG. 4(a) illustrates the electric field profile when the growth surface of the substrate S is located just above a base B of the resonance cavity C. The electric field profile is dominated by that of the empty chamber which is a $J_0$ Bessel function for a $TM_{01n}$ chamber. There is only a slight contribution to the electric field magnitude from the upper edge of the substrate forming a coaxial mode set up between the substrate and the chamber wall. In this arrangement, the electric field is high above a central region of the substrate and drops off significantly towards the edge of the substrate. As such, this electric field profile results in poor CVD diamond growth in a peripheral region of the substrate growth surface.

FIG. 4(b) illustrates the electric field profile when the growth surface of the substrate S is located high above the base B of the resonance cavity C. The electric field profile is now dominated by the coaxial mode set up between the substrate and the chamber wall which decays evanescently into a central region of the chamber. In this arrangement, the electric field is high above a peripheral region of the substrate and drops off towards the central region of the substrate. As such, this electric field profile results in poor CVD diamond growth in a central region of the substrate growth surface.

FIG. 4(c) illustrates the electric field profile when the growth surface of the substrate S is located at the correct height above a surrounding surface within the resonance cavity C. The electric field profile of the empty chamber is balanced with the coaxial mode set up between the substrate and the chamber wall to form a substantially uniform electric field region over the majority of the substrate with a ring of higher electric field localized around the substrate edge. The central region of the electric field is substantially uniform but has a slightly lower electric field region just inside the ring of higher electric field localized around the substrate edge. One would think that this lower electric field region would lead to poor CVD diamond growth at this region of the growth surface. However, in practice it has been found that the higher electric field ring immediately outside the region of lower electric field aids in pulling the plasma outwards, compensating for the slight non-uniformity in the central region and resulting in a large, flat, uniform plasma over the majority of the substrate enabling uniform CVD diamond growth over large areas. In practice, it has been found that a large, flat, uniform plasma over the majority of the substrate enabling uniform CVD diamond growth over large areas can be achieved when a ratio of substrate diameter/height of the growth surface of the substrate is in a range 10 to 14, 11 to 13.5, or 11.0 to 12.5, wherein the height of the growth surface of the substrate is relative to a mean height of a surface surrounding the substrate.

According to certain embodiments of the present invention the substrate holder has a rotational axis of symmetry lying within 1.0 mm, 0.5 mm, 0.25 mm, 0.2 mm, 0.15 mm, 0.10 mm, or 0.05 mm of the central rotational axis of symmetry of the resonance cavity. Furthermore, in use a substrate may be located and aligned on the substrate holder such that a the rotation axis of symmetry of the substrate lies within 1.0 mm, 0.5 mm or 0.2 mm of the central rotational axis of symmetry of the resonance cavity when located over the substrate holder.

Figure 5A:
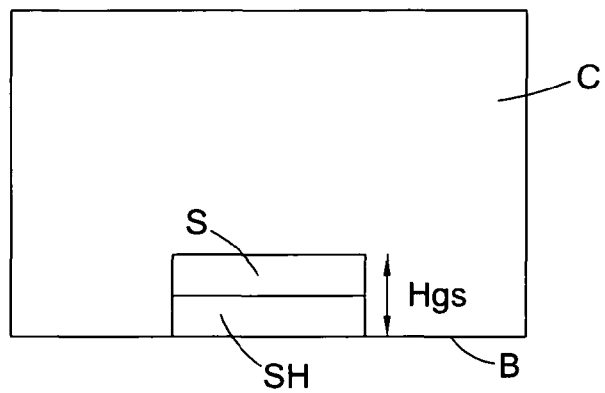
FIGS. 5(a) to 5(c) show how the height of the growth surface of the substrate is calculated relative to a mean height of a surface surrounding the substrate.
Figure 5B:
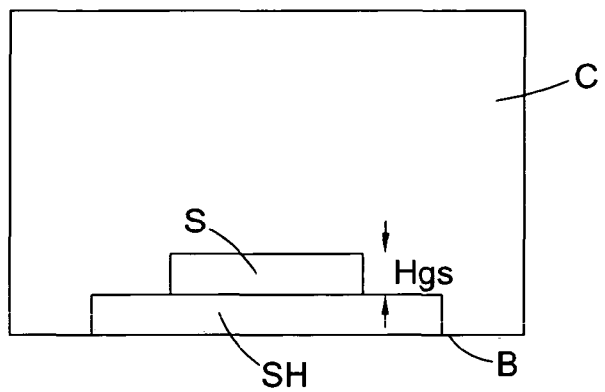

For an arrangement in which the substrate holder is the same diameter as the substrate, the substrate holder will be located wholly under the substrate and the surface surrounding the substrate may be formed by the base of the plasma chamber. As such, in this case the mean height of the surface surrounding the substrate will equate to the height of the base B of the plasma chamber C and the height of the growth surface of the substrate, $H_{gs}$, will be measured from the base of the plasma chamber surrounding the substrate S and substrate holder SH as illustrated in FIG. 5(a). Alternatively, for an arrangement in which the substrate holder is much larger than the substrate thus forming a large flat surface which surrounds the substrate, the mean height of the surface surrounding the substrate will equate to a top surface of the substrate holder. As such, in this case the height of the growth surface of the substrate, $H_{gs}$, will be measured from the top surface of the substrate holder SH surrounding the substrate S as illustrated in FIG. 5(b). For an arrangement in which the substrate holder extends outwards from the substrate with a sloped, curved, or stepped top surface surrounding the substrate then the mean height of the local surrounding surface, $H_{lss}$, can be defined by a mean of a height, $H_{local}$, of a cross section between the edge of the substrate, at Rs, and a distance approximately two times the thickness of the substrate, 2×Ts, away from the substrate edge, taken in a radial direction, X:

$$H_{lss} = \frac{1}{2Rs}\int_{Rs}^{Rs+2Ts} H_{local}\, dX$$

Figure 5C:
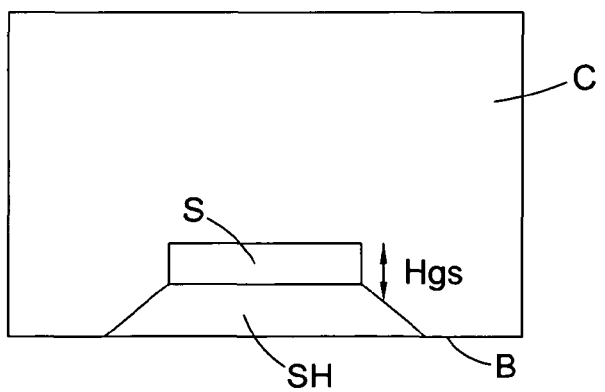

Such an arrangement is illustrated in FIG. 5(c) for a sloped substrate holder. For example, for a substrate holder having a top surface sloping away from the substrate at an angle of 45° to a distance 2×Ts from the substrate in a radial direction, the mean height of the surface surrounding the substrate will equate to half the height of the substrate holder SH. As such, in this case the height of the growth surface of the substrate, $H_{gs}$, will be measured from half the height of the substrate holder SH.

In relation to the above, it has been found that providing a step of a particular height between the substrate growth surface and the local surrounding surface perturbs the electric field profile of the plasma chamber in such a way that the electric field profile of the empty chamber is balanced with a coaxial mode set up between the substrate and the chamber wall to form a substantially uniform electric field region over the majority of the substrate with a ring of higher electric field localized around the substrate edge as previously described.

The magnitude of the coaxial mode set up between the substrate and the chamber wall can also be affected by the ratio of a resonance cavity diameter/substrate diameter. Accordingly, in certain arrangements it may be preferred to provide a configuration in which a ratio of resonance cavity diameter/substrate diameter is in the range 1.5 to 5, 2.0 to 4.5, or 2.5 to 4.0, wherein the resonance cavity diameter is measured at a height less than 50%, 40%, 30%, or 20% of a height of the resonance cavity. In one particularly preferred arrangement the aforementioned ratios hold when the resonance cavity diameter is measured at a height of the growth surface of the substrate.

Providing suitable substrate dimensions and correctly locating the substrate within the plasma chamber can thus aid providing a more uniform plasma over larger areas. Furthermore, the uniform plasma achieved by such configurations also provides relatively uniform heat flow towards the substrate which has been found to aid in alleviating the problem of cracking of the CVD diamond when the CVD diamond cools after growth. In this regard, stress balance in a CVD diamond wafer is largely determined by the variation in growth temperatures over the diamond wafer. Hotter regions during growth contract more during cool down, and are therefore in tension; cooler regions contract less, and therefore remain in compression. Variations in stress within the CVD diamond wafer during cooling can result in cracking. As such, large variations in substrate temperature are not desirable.

That said, one potential problem using the previously described arrangement is that the high electric field ring disposed around the edge of the substrate can lead to higher substrate temperatures at the edge of the substrate and this can potentially lead to cracking of the substrate when the CVD diamond material cools after growth. Indeed, rather than having a completely uniform temperature across the substrate growth surface as might be intuitively desired, the present inventors consider that it is actually desirable to ensure that the edge temperature of the substrate growth surface is lower that the temperature in a central region of the substrate growth surface. The reason for such an arrangement is that crack propagation can be minimised by ensuring that compressive regions within the CVD diamond material are near where cracks can originate, i.e. near the edge of the CVD diamond wafer. Accordingly, keeping the edge of the substrate growth surface slightly cooler than a central region during growth is considered to be advantageous in forming a compressive region near the edge of the resulting CVD diamond wafer. If a crack is initiated at an edge of a CVD diamond wafer during cooling, the compressive region near the edge of the CVD diamond wafer prevents the crack from propagating towards the centre of the CVD diamond wafer. As such, any cracks which are initiated tend to remain short and located at an outer edge of the CVD diamond wafer which can subsequently be processed to remove any minor edge damage. In this regard, it is advantageous to provide a substrate temperature control system an example of which is illustrated in the reactor configuration of FIG. 1.

The substrate 5 is spaced apart from the substrate holder 4 by spacer wires or spacer pads 20 to define a gas gap 22 between a supporting surface of the substrate holder 4 and a rear surface of the substrate 5. Furthermore a gas supply system 24 is coupled to the gas gap 22 via a supply pipe 26 which extends from the gas supply system 24 through the substrate holder 4 and is configured to supply gas into the gas gap 22 through one or more outlets in the supporting surface of the substrate holder. A coolant liquid supply system 28 is also provided for cooling the substrate holder 4.

The coolant liquid supply system 28 provides a rough basic cooling to the substrate holder. However, this system has been found to be insufficiently precise for the fine temperature control of the substrate which is considered to be required by the present inventors in order to obtain high quality, uniform deposition of CVD diamond over large areas. Accordingly, the gas supply system 24, 26 is provided in order to allow more precise control of the substrate temperature. The gas supply system may be configured to inject at least two gases having different thermal conductivities into the gas gap below the substrate and vary a ratio of the at least two gases in order to control the temperature of the substrate on the substrate holder. For example, the gas supply system may utilize a mixture of a light gas such as hydrogen and a heavy gas such as argon which is less thermally conductive. Advantageously, the gases used to control the temperature of the substrate are ones which are also utilized in the main process chemistry so that additional gas sources are not required. If the edge temperature of the substrate is too high relative to the central region of the substrate, the proportion of heavy gas relative to light gas can be increased to reduce the thermal conductivity of the gas under a central region of the substrate, thus causing the central region of the substrate to heat up relative to the edge of the substrate. Conversely, if the edge temperature of the substrate is too low relative to the central region of the substrate, the proportion of light gas relative to heavy gas can be increased to increase the thermal conductivity of the gas under a central region of the substrate, thus causing the central region of the substrate to cool down relative to the edge of the substrate. The absolute temperature of the substrate as well as the relative temperature of different regions of the substrate can also be controlled by varying gas flow and gas composition within the gas gap under the substrate.

The spacer wires 16 may be configured to define a central gas gap cavity under the substrate so that the gas pools in the central gas gap cavity. For example, the spacer wires 16 can be each arcuate in shape and configured into a ring with gaps therebetween through which gas can flow. The spacer elements may be electrically conductive and/or may be fixed in place with an electrically conductive adhesive such as Silver DAG™ which has been found to be useful in ensuring a good electrical contact between the spacer elements and the substrate holder. This aids in preventing the problem of arcing under the substrate which can detrimentally affect temperature control. It has also been noted that the position of gaps between the ring sections of the spacer wires can produce a variation in thickness of the diamond wafer. If desired, the number and position can be adjusted to compensate for other non-uniformities inherent in diamond wafers produced by a given reactor.

The microwave plasma reactor further comprises one or more temperature measurement devices configured to take at least two temperature measurements, including one or more measurements in a central region of the growth surface of the substrate and one or more measurements in a peripheral region of the growth surface of the substrate as previously described. The temperature measurements may be taken simultaneously or within a short time interval of each other and the substrate temperature control system may be used to ensure that the temperature gradient does not move outside the previously described ranges. The temperature measurement device may comprise a pyrometer 30 as illustrated in FIG. 1. Two pyrometers may be provided, one to take the central temperature measurements and one to take the peripheral temperature measurements.

Microwave plasma reactors may comprise further features such as a metallic temperature modifying ring disposed around the substrate. Such a temperature modifying ring performs two roles: it moves the ring of high electric field away from the substrate edge; and, being a separately heated (by plasma) and cooled (by the chamber base) item, it directly modifies the substrate edge temperature. As such, the ring can function to cool the edge of the substrate, reducing the magnitude of any tensile stresses, making cracking of the CVD diamond less likely. In addition, adjusting the temperature modifying ring disposed around the substrate can also modify overgrowth of CVD diamond down the edge of the substrate thereby aiding release of the CVD diamond material from the substrate. As with previously described structures, if any such a ring structure is provided within the plasma chamber then it should be ensured that it is rotationally symmetric and precisely aligned relative to the rotational axis of the plasma chamber to prevent asymmetries which are detrimental when growing large area optical quality synthetic diamond windows.

The substrate temperature control system may be configured to control the temperature of the growth surface of the substrate during CVD diamond growth thereon to fulfil the condition: $5°\,C.<T_c-T_e<120°\,C.$; $10°\,C.<T_c-T_e<100°\,C.$; $10°\,C.<T_c-T_e<80°\,C.$; $20°\,C.<T_c-T_e<80°\,C.$; or $20°\,C.<T_c-T_e<60°\,C.$, where $T_c$ is a temperature in the central region of the growth surface and $T_e$ is a temperature in the peripheral region of the growth surface. If Tc–Te becomes too large, excessive tension may be created in the central region of the CVD diamond wafer during cooling, leading to cracking in the central region of the CVD diamond wafer. If Tc–Te becomes too small, compressive regions will not form near the edge of the CVD diamond wafer and any cracks which initiate at the edge of the wafer are more likely to propagate across the CVD diamond wafer resulting in very long cracks, including complete wafer fracture.

Even when utilizing arrangements such as those described above, a number of problems may still exist, although these may be substantially alleviated by the previously described arrangements. For example, in some instances there may still be issues of non-uniform CVD diamond growth across the substrate, diamond wafer delamination from the substrate during CVD diamond growth, and crack initiation and/or propagation during cooling after growth of the CVD diamond wafer, particularly when larger substrates are used for growing large area polycrystalline diamond discs (e.g. 80 mm diameter or more) or when growing a plurality of single crystal diamonds in a single growth run on a plurality of single crystal diamond substrates adhered to a supporting substrate over a relatively large area (e.g. 80 mm diameter or more). This is particularly problematic as there is an on going need to increase the area over which high quality, uniform CVD diamond can be grown. Furthermore, these problems tend to be exacerbated when the substrates are reused in subsequent growth runs. This is particularly problematic for refractory metal substrates which are expensive and reuse is desirable in an economically competitive industrial process.

One possible solution considered by the inventors was that the quality of the growth surface was in some way affecting the release of a CVD diamond wafer on cooling after growth thus causing cracking. However, it was found that processing the growth surface to have a more precisely defined flatness and roughness did not in itself solve the problems. After much research focussed at addressing these issues, the present inventors have surprisingly found that the problems they have observed are a result of small variations in temperature across the growth surface of the substrate caused by very minor variations in the height of the gas gap under the substrate. In particular, the present inventors found that although the cylindrical refractory metal substrates provided by their supplier have nominally planar front and rear surfaces, these surfaces are not sufficiently flat. Minor flatness variations in a rear surface of the substrate result in minor variations in the height of the gas gap and it has been found that this results in differential cooling across the substrate. The temperature variations caused by the variations in the gas gap height result in stress variations in the CVD diamond on cooling after CVD diamond growth which can cause the diamond wafer to crack in at least a proportion of growth runs resulting in reduced yields.

While the previously described arrangements can control variations in temperature which are circumferentially symmetric, it can be more difficult to control temperature variations which are not circumferentially symmetric such as those caused by variations in the gas gap height. For example, refractory metal substrates tend to sag and buckle during use (despite being a long way from their melting point). Uniform sag mainly modifies Tc–Te which can be controlled as previously described. However, buckling introduces non-uniformities in the temperature around the wafer edge which are not symmetric. Therefore it is not easy to maintain the whole edge in compression. Typical buckling magnitudes can be greater than 20 micron (peak to valley). For a gas gap of approximately 200 microns, this corresponds to a 10% variation in thickness, and corresponding temperature variation. This can result in up to 60° C. variations in temperature around the wafer edge.

In order to solve this problem, it is advantageous to ensure that the height h of the gas gap varies by no more than 200 µm, 150 µm, 100 µm, 80 µm, 60 µm, 40 µm, 20 µm, 10 µm, or 5 µm. This may be achieved, for example, by further processing the rear surface of substrates provided by suppliers to have a very precisely defined profile which is complementary to the profile of the supporting surface of the substrate holder. For example, if the supporting surface of the substrate holder is flat, then the rear surface of the substrate should be processed to ensure that it is very precisely flat.

Accordingly, control of rear surface substrate shape by mechanical means (preferably uniform, non-directional processing, e.g. lapping rather than grinding) has been found to be advantageous. Furthermore, the supporting surface of the substrate holder may also be processed to have a precisely defined profile which is complementary to the rear surface of the substrate.

In addition to the above, it has also been found that some cylindrical refractory metal substrates provided by suppliers do not result in uniform, high quality CVD diamond wafers, even if both front and rear surfaces were processed as outlined above. Commercially available refractory metals often contain small amounts of graphite forming impurities such as iron and nickel. Even very small proportions of such impurities have been found to affect CVD diamond growth on the growth surface of such a substrate. Accordingly, in addition to applying the precise processing of both front and rear surfaces of the substrate as previously described, it is advantageous to use a carbide forming refractory metal substrate which has very high chemical purity with less than 0.5%, 0.1%, 0.075%, 0.05%, 0.025%, 0.01%, 0.005%, or 0.001% by weight of graphite forming impurities at the growth surface of the substrate.

Optionally, the growth surface has a surface roughness $R_a$ in the range 1 nm to 1 µm. It has been found that the roughness of the growth surface can affect both the crystal structure of the CVD diamond grown thereon and adhesion strength of the CVD diamond to the substrate. It has been found that a surface roughness $R_a$ in the range 1 nm to 1 µm has been found to be particularly useful to provide sufficient adhesion to the CVD diamond during growth to prevent early delamination during growth while providing a sufficiently low adhesion such that the diamond material can be released from the substrate on cooling after CVD growth without the material cracking. Preferred range of surface roughness may be 1 nm to 500 nm, 10 nm to 500 nm, 10 nm to 200 nm. Typically, the refractory metal discs are first lapped on a cast iron wheel using diamond grit suspended in a lapping fluid. In general, the lapping process is used for bulk material removal and also to achieve the required flatness for the given process. There are a few processes where the as-lapped surface is used. A typical $R_a$ value for the lapped finish is 100 nm to 500 nm. However, usually the lapped surface is then further processed using, for example, a grinding/polishing machine and using a finer grit to obtain a lower surface roughness value. Prior to CVD diamond growth, the refractory metal substrates may be cleaned to ensure all contamination from the lapping process has been removed and/or seeded to aid nucleation for diamond growth thereon.

Process Conditions

Using the aforementioned apparatus a process has been developed for fabricating high optical quality CVD diamond material over large areas. The process comprises:

locating a substrate over the substrate holder, the substrate being rotationally symmetric and having a rotation axis of symmetry lying within 1.0 mm of the central rotational axis of symmetry of the resonance cavity when located over the substrate holder;

feeding microwaves into the plasma chamber through the annular dielectric window at a power in a range 15 to 40 kW, 20 to 35 kW, or 25 to 30 kW;

feeding process gases into the plasma chamber through the one or more gas inlet nozzles, the process gases comprising an atomic concentration of hydrogen in a range 98 to 99%, an atomic concentration of carbon in a range 0.3 to 1.1%, and an atomic concentration of nitrogen in a range 30 to 270 ppm, wherein a total flow rate of the process gases lies in a range 2000 to 15000 sccm and a pressure within the plasma chamber lies in a range 140 to 235 Torr, 160 to 215 Torr, or 180 to 205 Torr;

growing a polycrystalline CVD diamond wafer on the substrate at a substrate temperature in a range 775 to 950° C., 800 to 900° C., or 825 to 875° C.;

removing the polycrystalline CVD diamond wafer from the microwave plasma reactor; and polishing the polycrystalline CVD diamond wafer.

High pressure, high power, high gas flow rate conditions have been found to be advantageous for synthesizing high optical quality material over large areas. However, such conditions are difficult to control in a uniform manner. The microwave plasma reactor and substrate configurations as previously described are capable of sustaining such conditions in a stable and uniform manner in order to achieve the present invention.

However, it has been found that even utilizing the previously described precisely-aligned microwave plasma reactor configuration, the quality of polycrystalline diamond material around a peripheral region of the polycrystalline diamond wafer may not meet extremely high optical quality requirements. In particular, levels of impurities such as non-diamond carbon have been found to increase at a peripheral region of larger area wafers. This problem is exacerbated when also growing to larger thicknesses because as a synthetic polycrystalline diamond wafer grows, grain boundaries increase in size and this leads to an increase in the rate of impurity uptake within the grain boundaries. It has been found that this problem can be alleviated by increasing the hydrogen gas flow rate. It is considered that the concentration of atomic hydrogen required to selectively etch off non-diamond carbon from the substrate is lower at very large diameters and thus the efficiency of non-diamond carbon etching is reduced. It is believed that increasing the hydrogen gas flow rate directed towards the growth surface pushes more atomic hydrogen to peripheral regions of the polycrystalline diamond wafer thus increasing the rate at which non-diamond carbon is etched from the growth surface and improving the quality of the material in peripheral regions of the growing wafer. An alternative or additional solution is to provide a gas inlet nozzle array having a plurality of gas inlet nozzles directed towards the growth surface of the substrate and disposed over an area sufficiently large to ensure that a sufficiently large concentration of atomic hydrogen is provided in peripheral regions of a polycrystalline diamond wafer during growth. Yet another alternative or additional solution is to reduce the growth rate of the polycrystalline CVD diamond wafer to allow more time for non-diamond carbon to be etched from the growth surface. For example, the growth rate may be decreased as a thickness of the polycrystalline CVD diamond wafer increases by, for example, reducing the atomic concentration of carbon and/or the atomic concentration of nitrogen during growth of the polycrystalline CVD diamond wafer on the substrate.

By combining developments in reactor design, engineering tolerance control, and process design it has been possible to achieve fabrication of large synthetic polycrystalline diamond windows having extremely high optical quality.

Figure 6A:
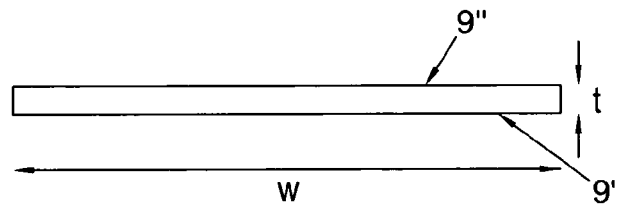
FIGS. 6(a) and 6(b) illustrate a large area optical quality polycrystalline CVD diamond wafer.
Figure 6B:
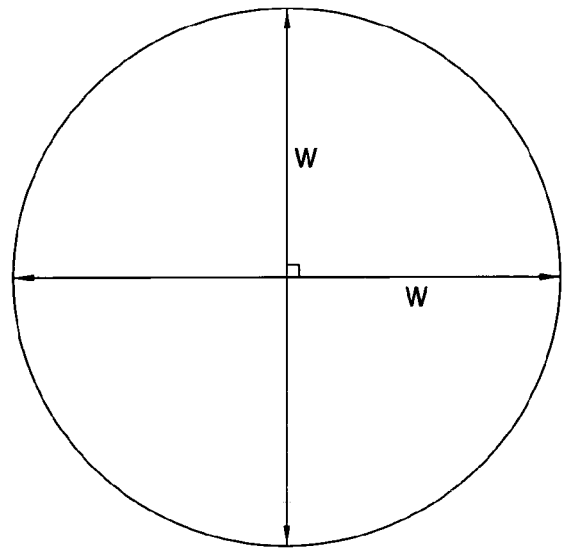

After polishing, the polycrystalline CVD diamond wafer may be further processed by performing a plasma or chemical treatment to generate an oxygen terminated surface on the polycrystalline CVD diamond wafer. This is useful as well as the surface termination can affect optical characteristics.
Product Using the apparatus and process conditions as described above, it is possible to fabricate a polycrystalline CVD diamond wafer as illustrated in FIGS. 6(a) and 6(b). The polycrystalline CVD diamond wafer comprising:

a polycrystalline chemical vapour deposited (CVD) diamond wafer comprising:
  a largest linear dimension equal to or greater than 125 mm;
  a thickness equal to or greater than 200 µm; and
  one or both of the following characteristics measured at room temperature (nominally 298 K) over at least a central area of the polycrystalline CVD diamond wafer, said central area being circular, centred on a central point of the polycrystalline CVD diamond wafer, and having a diameter of at least 70% of the largest linear dimension of the polycrystalline CVD diamond wafer:
  (1) an absorption coefficient≤0.2 cm$^{-1}$, ≤0.1 cm$^{-1}$, or ≤0.05 cm$^{-1}$ at 10.6 µm; and
  (2) a dielectric loss coefficient at 145 GHz, of tan δ≤2× 10$^{-4}$, ≤10$^{-4}$, ≤5×10$^{-5}$, ≤10$^{-5}$, ≤5×10$^{-6}$, or ≤10$^{-6}$.

Preferably, the polycrystalline CVD diamond wafer further comprises one or more of the following structural characteristics over at least the central area:
  (3) a tensile rupture strength with a nucleation face of the polycrystalline CVD diamond wafer in tension of: ≥760 MPa×n for a thickness of 200 to 500 µm; ≥700 MPa×n for a thickness of 500 to 750 µm; ≥650 MPa×n for a thickness of 750 to 1000 µm; ≥600 MPa×n for a thickness of 1000 to 1250 µm; ≥550 MPa×n for a thickness of 1250 to 1500 µm; ≥500 MPa×n for a thickness of 1500 to 1750 µm; ≥450 MPa×n for a thickness of 1750 to 2000 µm; or ≥400 MPa×n for a thickness of ≥2000 µm, wherein multiplying factor n is 1.0, 1.1, 1.2, 1.4, 1.6, 1.8, or 2.
  (4) a tensile rupture strength with a growth face of the polycrystalline CVD diamond wafer in tension of: ≥330 MPa×n for a thickness of 200 to 500 µm; ≥300 MPa×n for a thickness of 500 to 750 µm; ≥275 MPa×n for a thickness of 750 to 1000 µm; ≥250 MPa×n for a thickness of 1000 to 1250 µm; ≥225 MPa×n for a thickness of 1250 to 1500 µm; ≥200 MPa×n for a thickness of 1500 to 1750 µm; ≥175 MPa×n for a thickness of 1750 to 2000 µm; or ≥150 MPa×n for a thickness of ≥2000 µm, wherein multiplying factor n is 1.0 1.1, 1.2, 1.4, 1.6, 1.8, or 2.
  (5) a surface flatness≤5 µm, ≤4 µm, ≤3 µm, ≤2 µm, ≤1 µm, ≤0.5 µm, ≤0.2 µm, ≤ or 0.1 µm.

Preferably, the polycrystalline CVD diamond wafer further comprises one or more of the following characteristics over at least the central area:
  (6) an average black spot density no greater than 1 mm$^{-2}$, 0.5 mm$^{-2}$, or 0.1 mm$^{-2}$;
  (7) a black spot distribution such that there are no more than 4, 3, 2, or 1 black spots within any 3 mm$^2$ area;
  (8) an integrated absorbance per unit thickness of no more than 0.20 cm$^{-2}$, 0.15 cm$^{-2}$, 0.10 cm$^{-2}$, or 0.05 cm$^{-2}$, when measured with a corrected linear background in a range 2760 cm$^{-1}$ to 3030 cm$^{-1}$;
  (9) a thermal conductivity of no less than 1900 Wm$^{-1}$K$^{-1}$, 2000 Wm$^{-1}$K$^{-1}$, 2100 Wm$^{-1}$K$^{-1}$, or 2200 Wm$^{-1}$K$^{-1}$;
  (10) a total integrated scatter in a forward hemisphere no more than 1%, 0.5%, or 0.1% at 10.6 µm for a sample thickness of 0.7 mm with front and rear surfaces polished to a root mean squared roughness of less than 15 nm; and
  (11) a silicon concentration as measured by secondary ion mass spectrometry of no more than 10$^{17}$ cm$^{-3}$, 5×10$^{16}$ cm$^{-3}$, 10$^{16}$ cm$^{-3}$, 5×10$^{15}$ cm$^{-3}$, or 10$^{15}$ cm$^{-3}$.

Embodiments may comprise any combination of the aforementioned preferred characteristics. However, of the eleven recited characteristics given above, the polycrystalline CVD diamond wafer preferably comprises two, three, four, five, six, seven, eight, nine, ten, or most preferably all eleven of said characteristics.

Preferably, the diameter of the central area over which the above defined characteristics are met is at least 75%, 80%, 85%, 90%, 95%, or 99% of said largest linear dimension. That is, the above defined characteristics preferably extend over the majority or substantially all of the polycrystalline CVD diamond wafer.

The polycrystalline CVD diamond wafer may have at least one linear dimension, but preferably at least two orthogonal linear dimensions, equal to or greater than 125 mm, 130 mm, 135 mm, 140 mm, 145 mm, or 150 mm. For example, the polycrystalline CVD diamond wafer may be in the form of a substantially circular disk having a diameter corresponding to said dimensions. The thickness of the polycrystalline CVD diamond wafer may be equal to or greater than 250 µm, 350 µm, 450 µm, 500 µm, 750 µm, 1000 µm, 1500 µm, or 2000 µm.

The polycrystalline CVD diamond wafer may also be processed to have a surface roughness no more than 200 nm, 150 nm, 100 nm, 80 nm, 60 nm, or 40 nm. Furthermore, an antireflective structure may be formed in or on a surface of the polycrystalline CVD diamond wafer.

The polycrystalline CVD diamond wafer may be used in large area form or otherwise may be cut into smaller items depending on the end application.

Measurement Techniques

Absorption Coefficient

Laser calorimetry is the method of choice for measuring the absorptance of low loss materials and optical components. Details of this measurement can be found in *Test method for absorptance of optical laser components* ISO/FDIS 11551, International Organisation for Standardisation, Geneva (1995) and G. Turri et al, *Optical absorption, depolarization, and scatter of epitaxial single-crystal chemical-vapor-deposited diamond at 1.064 µm*, Optical Engineering 46(6), 064002 (2007). Laser calorimetry involves measuring the time-dependent rise and fall in temperature of a test specimen exposed to a laser of known power for a fixed time period. From an analysis of the temperature response of the specimen, the absorbance A can be determined, where A is defined as the fraction of incident laser power absorbed by the specimen. When the product of the absorption coefficient $\alpha$ with the sample thickness d is much less than unity, then $\alpha \approx A/d$. This approximation is reasonable for optical quality polycrystalline diamond. In addition, optical quality polycrystalline diamond is commonly used for $CO_2$ laser optics operating at 10.6 µm. Performing the laser calorimetry measurement using the 10.6 µm line of a $CO_2$ laser is therefore particularly appropriate for the present invention. Test specimens for calorimetry are prepared as follows. Firstly the growth and nucleation faces of the wafer are lapped and polished to a uniform, desired thickness. A minimum of 20 µm is polished off the nucleation face in order to remove any contamination which may have incorporated during the nucleation stage of synthesis. Secondly, a series of calorimetry test specimens are laser machined from the polished wafer. These specimens are further polished on both sides to an rms roughness of <15 nm.

Dielectric Loss

The dielectric loss coefficient tan $\delta$ of the material is measured using an open resonator technique. The resonator is characterized by a very high unloaded Q-factor, typically >100 000, and operates in a highly polarised $TEM_{00n}$ mode, where n denotes the number of half guided wavelengths between the two reflectors. Sample thickness must be controlled such that it is ideally of an integral number of half wavelengths in thickness at the measurement frequency. This technique is described in "Properties of bulk polycrystalline CVD diamond", by Sussmann et al, Diamond and related materials, 3 (1994) 303-312.

Tensile Strength

Strength testing of materials can be performed using different techniques, all of which have their advantages and disadvantages. These are well-known to persons skilled in the art. One method of testing for strength is the so-called 3-point bend test. The application of this technique to polycrystalline diamond specimens is detailed in Philosophical Magazine Vol. 83, No. 36, 4059-4070 (2003), *Strength of free-standing chemically vapour-deposited diamond measured by a range of techniques*, A. R. Davies, J. E. Field, C. S. J. Pickles. An as-grown CVD wafer is prepared for 3-point bend strength testing as follows. First, the growth and nucleation faces of the wafer are lapped and polished to a uniform, desired thickness. A minimum of 20 µm is polished off the nucleation face in order to remove any contamination which may have been incorporated during the nucleation stage of synthesis. Secondly, a series of 40 rectangular strength test specimens of lateral dimension 18 mm×2 mm are laser machined from the polished wafer. These specimens are extracted from across the entire wafer in order to provide an even sampling. The 3-point bend test is performed on a first 20 samples in which the nucleation face is in tension and a second 20 samples in which the growth face is in tension. The mean strength of the nucleation and growth faces is determined by calculating the arithmetic mean of each sample set.

Black Spots

Optical microscopy is used for the analysis of black spots. Optical microscopy of polycrystalline diamond samples in general reveals the presence of microscopic crack-like features (termed "black spots") formed during synthesis within individual grains, which are most probably a result of inter-grain stress. These spots have diverse shapes, however typically have a radius of approximately 50-100 micron, and have been shown to have a negative impact upon certain physical properties of the film. Black spots can be inspected under a ×50 microscope.

Integrated Absorption

Integrated absorption per unit thickness of the sample is measured using an FTIR spectrometer. The absorption associated with stretch modes of $CH_x$ species within the film lies between 2760 $cm^{-1}$ to 3030 $cm^-$. This absorption was measured at room temperature, using an aperture size of 5 mm in an FTIR spectrometer scanning between 400 $cm^{-1}$ and 4000 $cm^{-1}$. A linear baseline is subtracted from the peak before the integrated area is calculated. The technique is described in "Thermal conductivity measurements on CVD diamond", by Twitchen et al, Diamond and related materials, (2001) 731-735.

Thermal Conductivity

Thermal conductivity is measured in thick diamond wafers using the proven relationship between thermal conductivity and the CHx component of the FTIR absorption spectrum. This relationship is described in "Thermal conductivity measurements on CVD diamond", by Twitchen et al, Diamond and related materials, 10 (2001) 731-735. The integrated area of the CHx components in the region 2760 $cm^{-1}$ to 3030 $cm^{-1}$ of the IR spectrum of the diamond window, once corrected with a linear baseline, has been shown to be quantitatively related to the thermal conductivity of diamond.

Optical Scatter

Total integrated scatter in the forward direction is measured using a so-called Coblentz sphere capable of collecting forward scattered light at an angle≥2.5° with respect to the incident light beam. The technique is described in J. C. Stover, *Optical Scattering: Measurement and Analysis*, SPIE Press Monograph (1995). The 10.6 µm line of a $CO_2$ laser is used for these measurements. Test specimens for scatter measurements are prepared as follows. Firstly the growth and nucleation faces of the wafer are lapped and polished to a uniform, desired thickness. A minimum of 20 µm is polished off the nucleation face in order to remove any contamination which may have incorporated during the nucleation stage of synthesis. Secondly, a series of test specimens are laser machined from the polished wafer. These specimens are further polished on both sides to an rms roughness of <15 nm.

EXAMPLE

A 140 mm diameter refractory metal carbide forming substrate suitable for synthesising polycrystalline CVD wafers was prepared using standard lapping and polishing processes to produce a surface with an $R_a$ of 20-60 nm.

This substrate was introduced into a CVD reactor, and the synthesis process started. Reaction gases were flowed into the reactor at flows of 3500/43/43 sccm for Hydrogen/Methane/Argon. A controlled level of nitrogen was introduced to provide a concentration in the gas phase of 150 ppb, as quantified by optical emission spectroscopy.

The pressure in the chamber was kept at 185 Torr and the mean temperature of the substrate was adjusted to be 830° C. and was held at this point through the course of the growth run. The difference in substrate temperature from centre to edge was maintained at less than 30° C.

Figure 7:
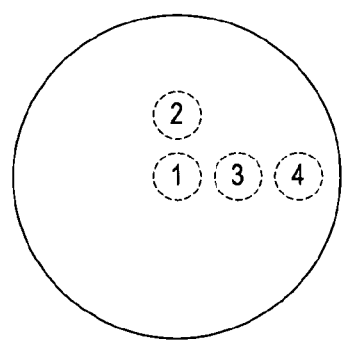
FIG. 7 illustrates four 20 mm diameter test samples extracted for laser calorimetry measurement from a parent wafer of 140 mm diameter according to an embodiment of the present invention.

The synthesis process was terminated following a minimum diamond wafer deposition thickness of 1.0 mm. The diamond wafer was removed from the substrate. A 20 μm thick layer was lapped off the nucleation face. The growth face was lapped to produce a substantially flat wafer of average thickness 0.84 mm. From this, four 20 mm diameter test samples were laser cut for laser calorimetry measurement at 10.6 μm, extracted according to FIG. 7.

The four test samples were further polished on both sides to an rms roughness<15 nm with minimal removal of material. The mean absorption coefficient α at 10.6 μm for each of these four test samples was determined to be less than 0.2 cm$^{-1}$. Further measurements have been taken in accordance with the previously described measurement techniques and fall within the numerical ranges as defined in the product section.

While this invention has been particularly shown and described with reference to preferred embodiments, it will be understood to those skilled in the art that various changes in form and detail may be made without departing from the scope of the invention as defined by the appendant claims.

The invention claimed is:

1. A polycrystalline chemical vapour deposited (CVD) diamond wafer comprising:
   a largest linear dimension equal to or greater than 125 mm;
   a thickness equal to or greater than 200 μm; and
   one or both of the following characteristics measured at room temperature (nominally 298 K) over at least a central area of the polycrystalline CVD diamond wafer, said central area being circular, centred on a central point of the polycrystalline CVD diamond wafer, and having a diameter of at least 70% of the largest linear dimension of the polycrystalline CVD diamond wafer:
   a dielectric loss coefficient at 145 GHz, of tan δ≤5×10$^{-5}$; and
   a thermal conductivity of no less than 1900 Wm$^{-1}$K$^{-1}$.

2. A polycrystalline CVD diamond wafer according to claim 1, wherein the polycrystalline CVD diamond wafer further comprises one or more of the following characteristics over at least the central area:
   a tensile rupture strength with a nucleation face of the polycrystalline CVD diamond wafer in tension of: ≥760 MPa×n for a thickness of 200 to 500 μm; ≥700 MPa×n for a thickness of 500 to 750 μm; ≥650 MPa×n for a thickness of 750 to 1000 μm; ≥600 MPa×n for a thickness of 1000 to 1250 μm; ≥550 MPa×n for a thickness of 1250 to 1500 μm; ≥500 MPa×n for a thickness of 1500 to 1750 μm; ≥450 MPa×n for a thickness of 1750 to 2000 μm; or ≥400 MPa×n for a thickness of 2000 μm, wherein multiplying factor n is 1.0, 1.1, 1.2, 1.4, 1.6, 1.8, or 2;
   a tensile rupture strength with a growth face of the polycrystalline CVD diamond wafer in tension of: ≥330 MPa×n for a thickness of 200 to 500 μm; ≥300 MPa×n for a thickness of 500 to 750 μm; ≥275 MPa×n for a thickness of 750 to 1000 μm; ≥250 MPa×n for a thickness of 1000 to 1250 μm; ≥225 MPa×n for a thickness of 1250 to 1500 μm; ≥200 MPa×n for a thickness of 1500 to 1750 μm; ≥175 MPa×n for a thickness of 1750 to 2000 μm; or ≥150 MPa×n for a thickness of ≥2000 μm, wherein multiplying factor n is 1.0 1.1, 1.2, 1.4, 1.6, 1.8, or 2;
   a surface flatness≤5 μm, ≤4 μm, ≤3 μm, ≤2 μm, ≤1 μm, ≤0.5 μm, ≤0.2 μm, ≤ or 0.1 μm.

3. A polycrystalline CVD diamond wafer according to claim 1, wherein the polycrystalline CVD diamond wafer further comprises one or more of the following characteristics over at least the central area:
   an average black spot density no greater than 1 mm$^{-2}$, 0.5 mm$^{-2}$, or 0.1 mm$^{-2}$;
   a black spot distribution such that there are no more than 4, 3, 2, or 1 black spots within any 3 mm$^2$ area;
   an integrated absorbance per unit thickness of no more than 0.20 cm$^{-2}$, 0.15 cm$^{-2}$, 0.10 cm$^{-2}$, or 0.05 cm$^{-2}$, when measured with a corrected linear background in a range 2760 cm$^{-1}$ to 3030 cm$^{-1}$;
   a thermal conductivity of no less than 2000 Wm$^{-1}$K$^{-1}$, 2100 Wm$^{-1}$K$^{-1}$, or 2200 Wm$^{-1}$K$^{-1}$;
   a total integrated scatter in a forward hemisphere no more than 1%, 0.5%, or 0.1% at 10.6 μm for a sample thickness of 0.7 mm with front and rear surfaces polished to a root mean squared roughness of less than 15 nm; and
   a silicon concentration as measured by secondary ion mass spectrometry of no more than 10$^{17}$ cm$^{-3}$, 5×10$^{16}$ cm$^{-3}$, 10$^{16}$ cm$^{-3}$, 5×10$^{15}$ cm$^{-3}$, or 10$^{15}$ cm$^{-3}$.

4. A polycrystalline CVD diamond wafer according to claim 1, wherein the largest linear dimension is equal to or greater than 130 mm, 135 mm, 140 mm, 145 mm, or 150 mm.

5. A polycrystalline CVD diamond wafer according to claim 1, wherein the diameter of the central area is at least 75%, 80%, 85%, 90%, 95%, or 99% of said largest linear dimension.

6. A polycrystalline CVD diamond wafer according to claim 1, wherein the polycrystalline CVD diamond wafer comprises at least two orthogonal linear dimensions equal to or greater than 125 mm, 130 mm, 135 mm, 140 mm, 145 mm, 150 mm, or 160 mm.

7. A polycrystalline CVD diamond wafer according to claim 1, wherein the thickness is equal to or greater than 250 μm, 350 μm, 450 μm, 500 μm, 750 μm, 1000 μm, 1500 μm, or 2000 μm.

8. A polycrystalline CVD diamond wafer according to claim 1, wherein the absorption coefficient measured at room temperature is ≤0.1 cm$^{-1}$ or ≤0.05 cm$^{-1}$ at 10.6 μm.

9. A polycrystalline CVD diamond wafer according to claim 1, wherein the dielectric loss coefficient tan δ measured at room temperature at 145 GHz is ≤10$^{-4}$, ≤5×10$^{-5}$, ≤10$^{-5}$, ≤5×10$^{-6}$, or ≤10$^{-6}$.

10. A polycrystalline CVD diamond wafer according to claim 1, wherein the polycrystalline CVD diamond wafer has an oxygen terminated surface.

11. A polycrystalline CVD diamond wafer according to claim 1, wherein a surface roughness of the polycrystalline CVD diamond wafer is no more than 200 nm, 150 nm, 100 nm, 80 nm, 60 nm, or 40 nm.

12. A polycrystalline CVD diamond wafer according to claim 1, wherein an antireflective structure is formed in or on a surface of the polycrystalline CVD diamond wafer.

* * * * *